(12) United States Patent
Boyd et al.

(10) Patent No.: US 10,090,258 B1
(45) Date of Patent: Oct. 2, 2018

(54) CRACK-STOP STRUCTURE FOR AN IC PRODUCT AND METHODS OF MAKING SUCH A CRACK-STOP STRUCTURE

(71) Applicant: GLOBALFOUNDRIES Inc., Grand Cayman (KY)

(72) Inventors: Kevin Boyd, Ballston Spa, NY (US); Robert Fox, Greenfield Center, NY (US); Jeannine Trewhella, Troy, NY (US); Roderick Alan Augur, Saratoga Springs, NY (US); Nicholas A. Polomoff, Irvine, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/713,843

(22) Filed: Sep. 25, 2017

(51) Int. Cl.
| | |
|---|---|
| *H01L 23/00* | (2006.01) |
| *H01L 23/31* | (2006.01) |
| *H01L 21/768* | (2006.01) |
| *H01L 23/535* | (2006.01) |

(52) U.S. Cl.
CPC ...... *H01L 23/562* (2013.01); *H01L 21/76805* (2013.01); *H01L 21/76843* (2013.01); *H01L 21/76877* (2013.01); *H01L 23/535* (2013.01); *H01L 23/564* (2013.01)

(58) Field of Classification Search
None
See application file for complete search history.

(56) References Cited

U.S. PATENT DOCUMENTS

| | | |
|---|---|---|
| 6,261,945 B1 | 7/2001 | Nye, III et al. |
| 6,495,918 B1 | 12/2002 | Brintzinger |
| 7,109,093 B2 | 9/2006 | Fitzsimmons et al. |
| 7,687,915 B2 | 3/2010 | Lee et al. |
| 8,076,756 B2 | 12/2011 | Lane et al. |
| 8,981,551 B2 | 3/2015 | Delpech et al. |
| 9,190,318 B2 | 11/2015 | Daubenspeck et al. |
| 9,397,054 B2 | 7/2016 | Daubenspeck et al. |
| 2007/0102792 A1 | 5/2007 | Wu |
| 2008/0099884 A1* | 5/2008 | Inohara ............... H01L 23/562 257/620 |
| 2015/0076688 A1 | 3/2015 | Daubenspeck et al. |
| 2015/0325540 A1 | 11/2015 | Daubenspeck et al. |
| 2016/0181208 A1 | 6/2016 | Bao et al. |

\* cited by examiner

*Primary Examiner* — Alexander Ghyka
(74) *Attorney, Agent, or Firm* — Amerson Law Firm, PLLC

(57) ABSTRACT

One illustrative crack-stop structure disclosed herein may include a first crack-stop metallization layer comprising a first metal line layer that has a plurality of openings formed therein and a second crack-stop metallization layer positioned above and adjacent the first crack-stop metallization layer, wherein the second crack-stop metallization layer has a second metal line layer and a via layer, and wherein the via layer comprises a plurality of vias having a portion that extends at least partially into the openings in the first metal line layer of the first crack-stop metallization layer so as to thereby form a stepped, non-planar interface between the first metal line layer of the first crack-stop metallization layer and the via layer of the second crack-stop metallization layer.

16 Claims, 24 Drawing Sheets

CRACK-STOP STRUCTURE FOR AN IC PRODUCT AND METHODS OF MAKING SUCH A CRACK-STOP STRUCTURE

BACKGROUND OF THE INVENTION

1. Field of the Invention

The present disclosure generally relates to the fabrication of semiconductor devices, and, more particularly, to various novel crack-stop structures for an integrated circuit (IC) product and methods of making such crack-stop structures.

2. Description of the Related Art

Modern IC products include a very large number of circuit elements or semiconductor devices such as, for example, field effect transistors (FETs), bi-polar transistors, capacitors, resistors, etc., formed on a very small area of a semiconductor substrate or chip. The semiconductor devices in the active area of the IC product are arranged in various circuits that are part of various functional components of the IC product, e.g., a microprocessor (logic area), a memory array (memory area), an ASIC, etc. Like all electronic devices, semiconductor devices in an IC product need to be electrically connected through wiring so that they may operate as designed. In an IC product, such wiring is done through multiple metallization layers formed above a semiconductor substrate. The semiconductor manufacturing process typically includes two major components: Front-End-of-Line (FEOL) processing operations, which include performing the various processes that are required to form the semiconductor devices (e.g., transistors, capacitors, etc.) on the semiconductor substrate; and Back-End-Of-Line (BEOL) processing operations, which include forming of the metallization layers after the semiconductor devices have been formed.

These metallization layers are typically comprised of conductive metal lines and conductive vias formed in layers of insulating material (e.g., silicon dioxide, a low-k material). More specifically, the conductive lines of the metallization layers, i.e., the metal lines, provide the intra-level electrical connections, while the conductive vias provide the inter-level connections or vertical connections between the metal lines in different metallization layers. The insulating layers disposed between two successive metal layers may be referred to as inter-level dielectric (ILD) layers. The conductive vias are typically positioned in the ILD layers. These conductive lines and conductive vias may be comprised of a variety of different materials, e.g., copper, with appropriate barrier layers, etc., and they are typically formed in the layers of insulating material using known damascene or dual-damascene techniques As a result of the reduced dimensions of the transistor devices, the operating speed of the circuit components has been increased with every new product generation, and the "packing density," i.e., the number of transistor devices per unit area, in such products has also increased over time. Thus, a modern IC product contains several metallization layers, e.g., with more complex IC products comprising more metallization layers than less complex products. In general, various device-level contacts are formed so as to establish electrical connection to the actual semiconductor devices (e.g., the transistors) formed during the FEOL processing operations. These device level contacts include, for example, trench silicide structures that establish an electrical connection to the source/drain regions of a transistor, a gate contact structure that establishes electrical contact to the gate structure of a transistor, and a plurality of source/drain contact structures that are electrically coupled to the trench silicide structures. Other device level contacts are also formed to establish electrical connection to other semiconductor devices, such as resistors, capacitors, etc. The formation of these device level contacts is sometimes referred to as "Middle-Of-Line" (MOL) processing operations.

After the formation of the device level contacts, BEOL processing operations are performed to form the various metallization layers for the IC product. The first metallization layer in an IC product above the device level contacts is typically referred to as the "M1" metallization layer or "metal-1" layer. The M1 metallization layer comprises a plurality of "M1" metal lines that are conductively coupled to the device level contacts by a plurality of vias that are typically referred to as "V0" vias. Thereafter, additional metallization layers are sequentially formed above the IC product, i.e., an M2/V1 metallization layer is formed above the M1/V0 metallization layer, and an M3/V2 metallization layer is formed above the M2/V1 metallization layer. In some IC products, a so-called M0 metal layer may be formed between the M1 metallization layer (M1/V0) with the V0 vias contacting the M0 metal layer.

An IC product typically comprises an active device region that is surrounded by a "crack-stop" structure and an inactive region positioned outside of the crack-stop structure. The functional electrical circuits of the IC product are formed in the active device region. Among other things, the crack-stop structure is designed to prevent crack propagation when the substrate is diced (cut) in later processing operations. The crack-stop structure is particularly designed to prevent crack propagation between different metallization layers.

A crack-stop structure, much like the active metallization layers formed for the functioning circuits in the active region, typically includes multiple metallization layers comprised of metal lines that are coupled to one another by metal via structures that are formed in insulation layers positioned between the metal layers of the crack-stop structure.

FIG. 2 depicts one illustrative embodiment of an illustrative prior art crack-stop structure 16 for the IC product 10 that is formed above a semiconductor substrate 20. A layer of insulating material 22 with a plurality of device level contacts 28 (CA) positioned therein has been formed above the substrate 20. The device level contacts 28 may be, for example, conductive contacts to source/drain regions of transistor devices (not shown) that are formed under the crack-stop structure 16. Also depicted in FIG. 2 are multiple etch-stop layers 24 (e.g., silicon nitride) and multiple layers of insulating material 26 (silicon dioxide).

In a crack-stop structure each of the metal layers (e.g., M1, M2 and M3) has a substantially planar upper surface and all of the vias have a substantially planar lower surface that is adapted to engage and contact the substantially planar upper surface of the underlying metal layer thereby forming a substantially planar interface between the vias and the crack-stop metallization layer below the vias. Unfortunately, in some cases, a crack can cause separation between some of the crack-stop metallization layers of the crack-stop structure. More specifically, in some cases a crack may propagate through the crack-stop structure by forcing separation along the planar interfaces established between the upper planar surface of a metal layer (e.g., the M1 metal layer) and the lower planar surface of the various vias (e.g., V1 vias) that engage the planar upper surface of the metal layer. This type of failure may be catastrophic in nature in that it may render the IC product incapable of performing its intended functions, thereby causing scrapping of material and reduced product yields.

The present disclosure is directed to various novel crack-stop structures for an integrated circuit (IC) product and methods of making such crack-stop structures that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel crack-stop structures for an integrated circuit (IC) product and methods of making such crack-stop structures. One illustrative crack-stop structure disclosed herein may include a first crack-stop metallization layer comprising a first metal line layer that has a plurality of openings formed therein and a second crack-stop metallization layer positioned above and adjacent the first crack-stop metallization layer, wherein the second crack-stop metallization layer has a second metal line layer and a via layer, and wherein the via layer comprises a plurality of vias having a portion that extends at least partially into the openings in the first metal line layer of the first crack-stop metallization layer.

One illustrative method disclosed for forming a crack-stop structure may include forming a first metal line layer of a first crack-stop metallization layer, wherein the first metal line layer comprises a plurality of openings, and forming a second crack-stop metallization layer above and adjacent the first crack-stop metallization layer, the second crack-stop metallization layer comprising a second metal line layer and a via layer, wherein forming the second crack-stop metallization layer includes forming the via layer such that it has a plurality of vias, each of which comprises an extended portion that extends at least partially into the openings in the first metal line layer of the first crack-stop metallization layer so as to thereby form a stepped, non-planar interface between the first metal line layer of the first crack-stop metallization layer and the via layer of the second crack-stop metallization layer.

BRIEF DESCRIPTION OF THE DRAWINGS

The disclosure may be understood by reference to the following description taken in conjunction with the accompanying drawings, in which like reference numerals identify like elements, and in which.

Figure 1:
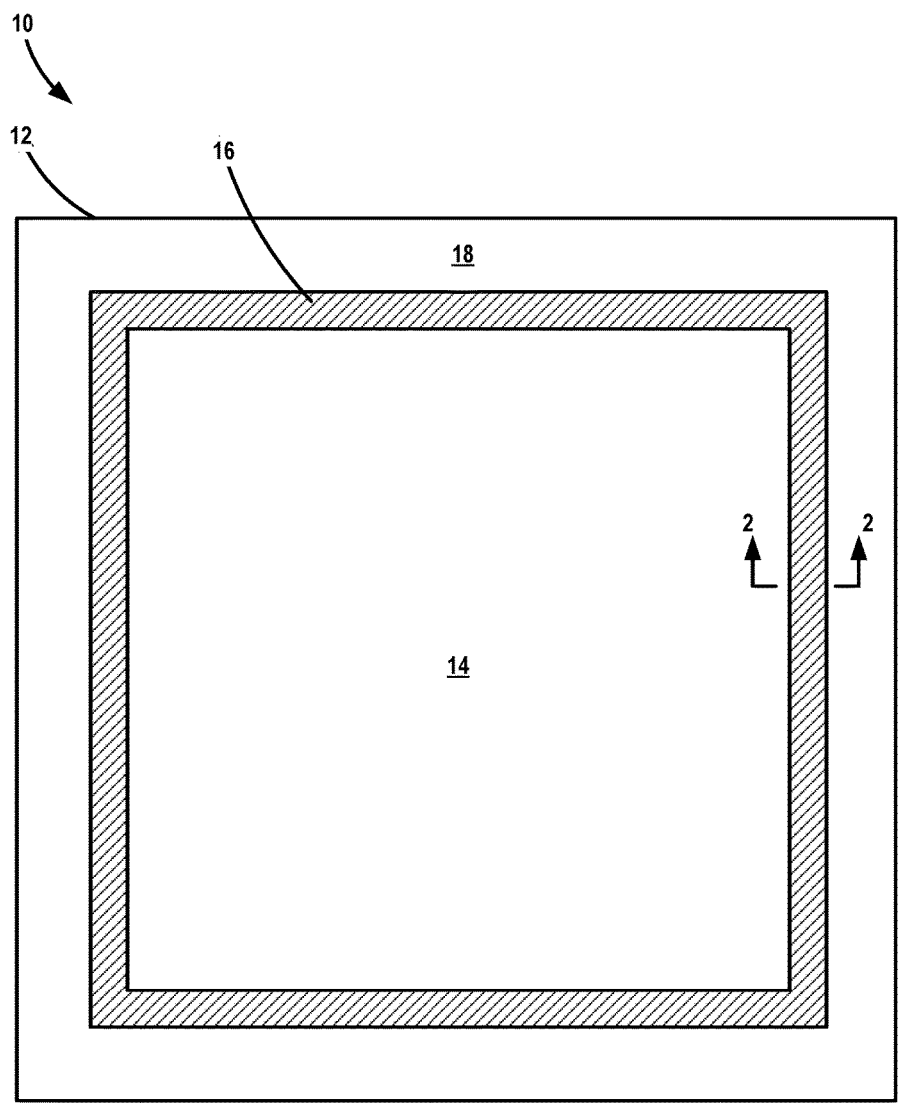
FIGS. 1-5 are drawings that depict aspects of an illustrative prior art crack-stop structure that may be formed on an IC product.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 is a simplistic plan view of a prior art IC product 10 that is formed above a semiconductor substrate 12. In general, the product 10 comprises an active device region 14 that is surrounded by a simplistically depicted "crack-stop" structure 16 and an inactive region 18 positioned outside of the crack-stop structure 16. The functional electrical circuits of the product 10 are formed in the active device region 14. The product 10 also typically includes a moisture barrier (not shown) that may be arranged closer to the active region 14 than the crack-stop structure 16. Among other things, the crack-stop structure 16 is designed to prevent crack propagation when the substrate is diced (cut) in later processing operations. The crack-stop structure 16 is particularly designed to prevent crack propagation between different metallization layers. The moisture barrier is designed to prevent the moisture from entering the active region 14 of the product 10 during dicing, packaging and assembly process operations that are performed to complete the final IC product 10 that is thereafter commercially sold.

The crack-stop structure 16, much like the active metallization layers formed for the functioning circuits in the active region 14, typically includes multiple metallization layers comprised of metal lines that are coupled to one another by metal via structures that are formed in insulation layers positioned between the metal layers of the crack-stop structure 16. The crack-stop structure 16 may also include a pre-metal dielectric layer disposed between the substrate 12 and the first metallization layer of the crack-stop structure 16. The crack-stop structure 16, as well as any semiconductor devices formed below the crack-stop structure 16, do not perform any electrical function for the IC product 10. The metal lines and vias of the crack-stop structure 16 are typically formed at the same time as the active metallization layers are formed.

Figure 2:
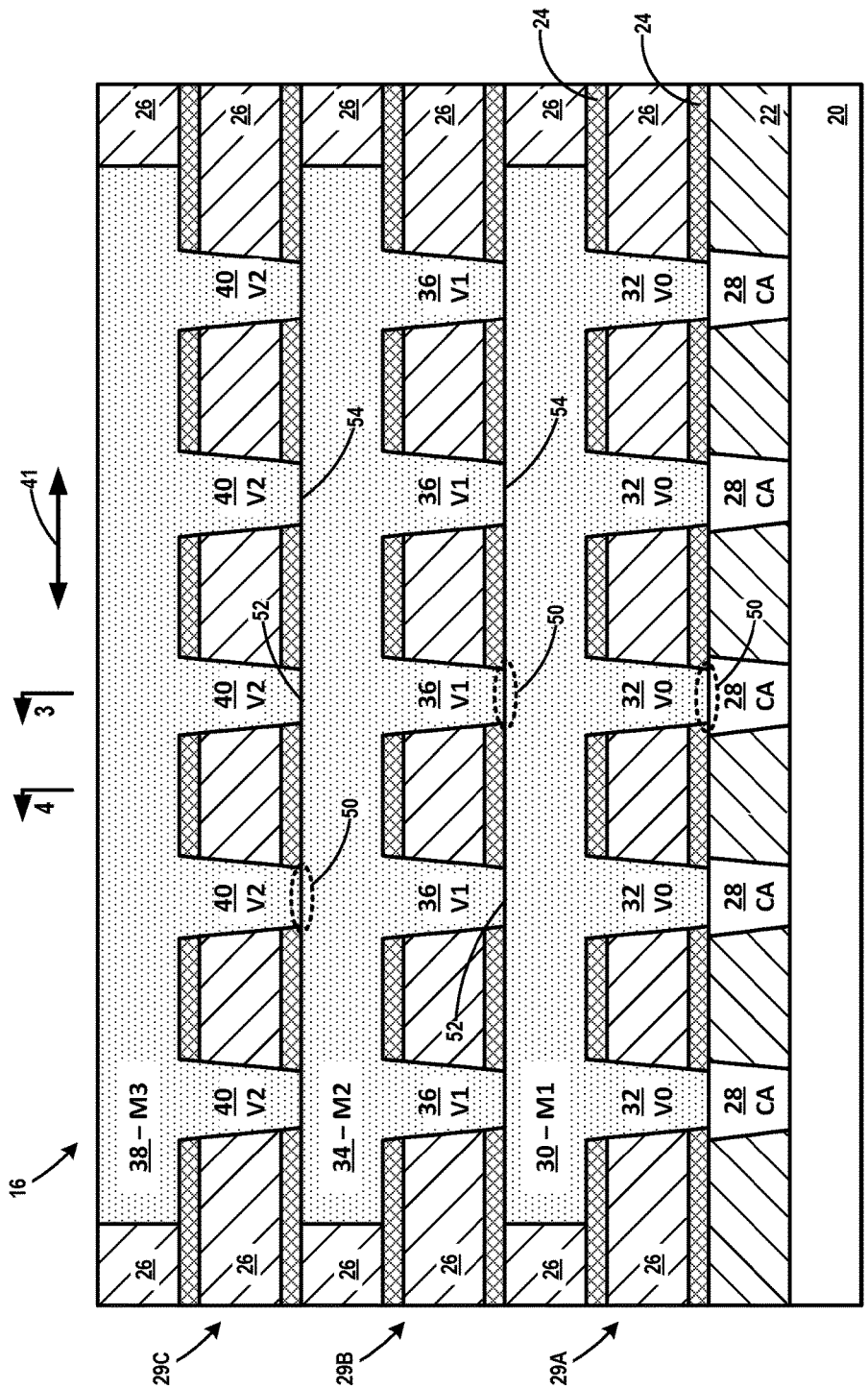

FIG. 2 depicts one illustrative embodiment of an illustrative prior art crack-stop structure 16 for the IC product 10 that is formed above a semiconductor substrate 20. A layer of insulating material 22 with a plurality of device level contacts 28 (CA) positioned therein has been formed above the substrate 20. The device level contacts 28 may be, for example, conductive contacts to source/drain regions of transistor devices (not shown) that are formed under the crack-stop structure 16. Also depicted in FIG. 2 are multiple etch-stop layers 24 (e.g., silicon nitride) and multiple layers of insulating material 26 (silicon dioxide).

Figure 3:
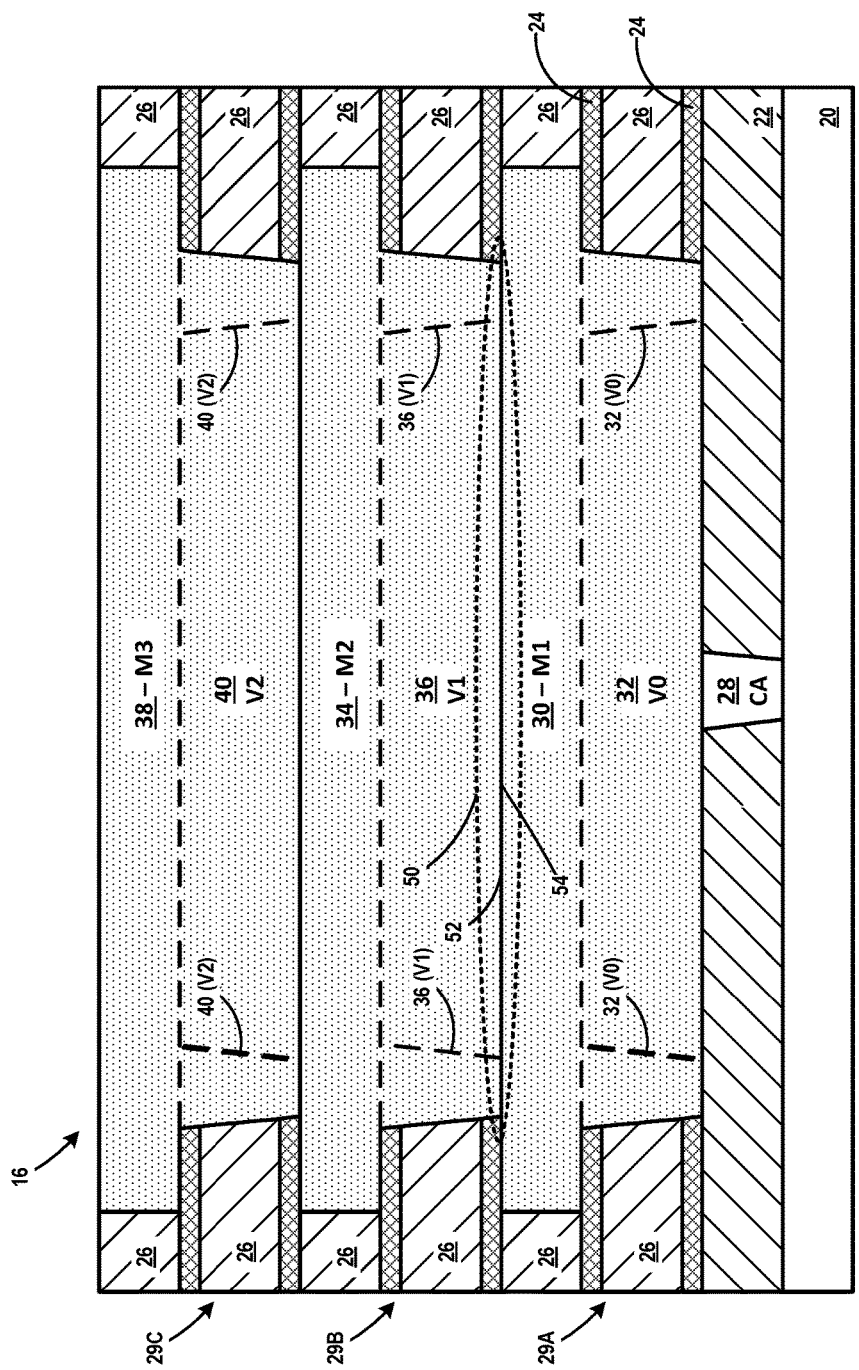
Figure 4:
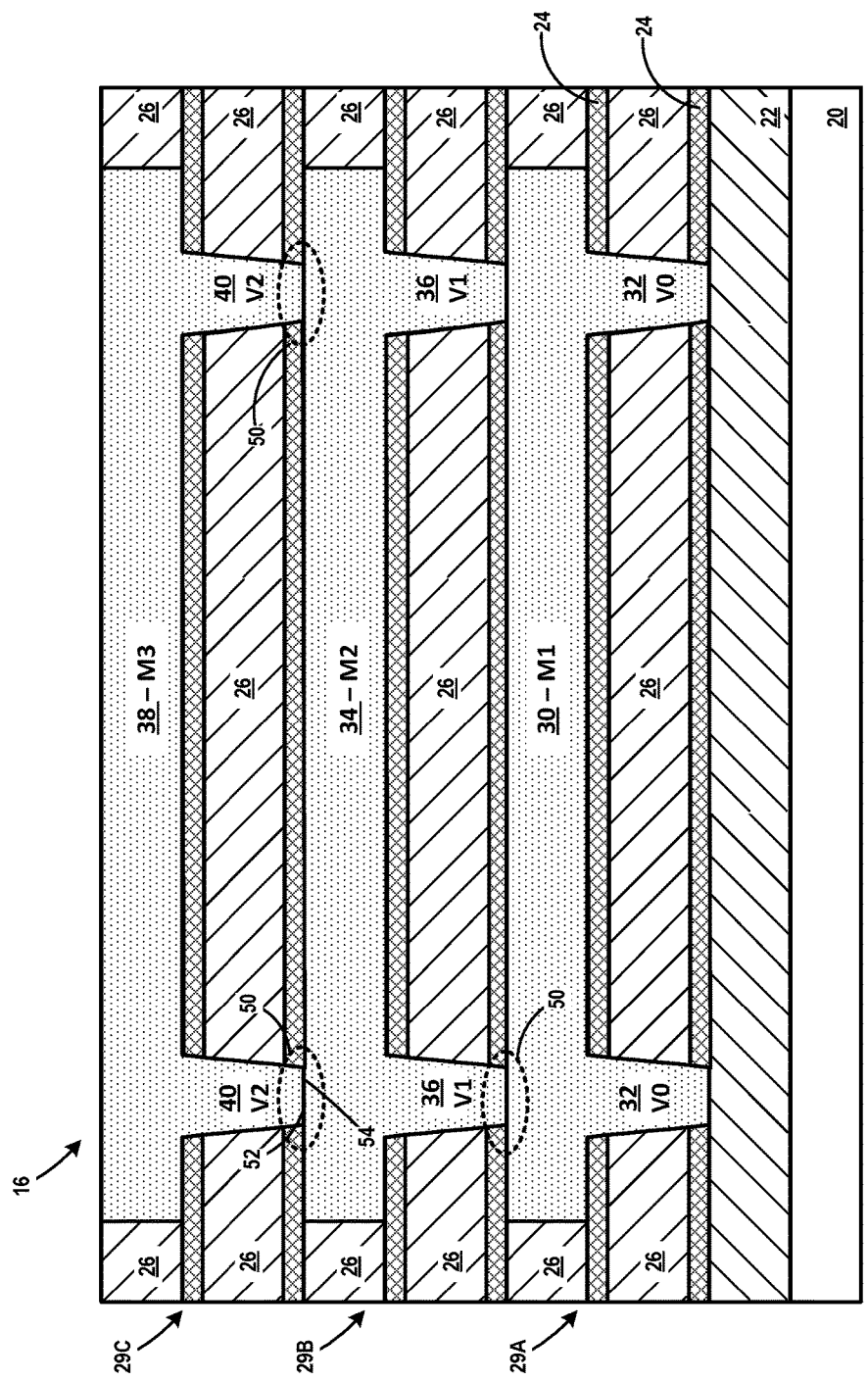

FIG. 2 also shows the first three metallization layers 29A-C (collectively referenced using the reference numeral 29) of the crack-stop structure 16. The crack-stop metallization layer 29A comprises the M1 metal layer 30 and a plurality of V0 vias 32, the crack-stop metallization layer 29B comprises the M2 metal layer 34 and a plurality of V1 vias 36 and the crack-stop metallization layer 29C comprises the M3 metal layer 38 and a plurality of V2 vias 40. Each of the metal layers (M1, M2 and M3) of the crack-stop metallization layers 29 are substantially uniform and continuous layers of metal that extend across the crack-stop structure 16 (in the direction indicated by the double arrowed line 41) for the entire lateral width of the crack-stop structure 16. Each of the metal layers (M1, M2 and M3) has a substantially planar upper surface 54. All of the vias have a substantially planar lower surface 52 that is adapted to engage and contact the substantially planar upper surface 54 of the underlying metal layer thereby forming a substantially planar interface 50 between the vias and the crack-stop metallization layer 29 below the vias. FIG. 3 is a cross-sectional view taken where indicated in FIG. 2, i.e., through the via structures (32, 36 and 40) and the metal layers (30, 34 and 38) in the crack-stop metallization layers 29. FIG. 4 is a cross-sectional view taken wherein indicated in FIG. 2, i.e., through the various insulating layers (24, 26) and the metal layers (30, 34 and 38) in the crack-stop metallization layers 29.

Figure 5:
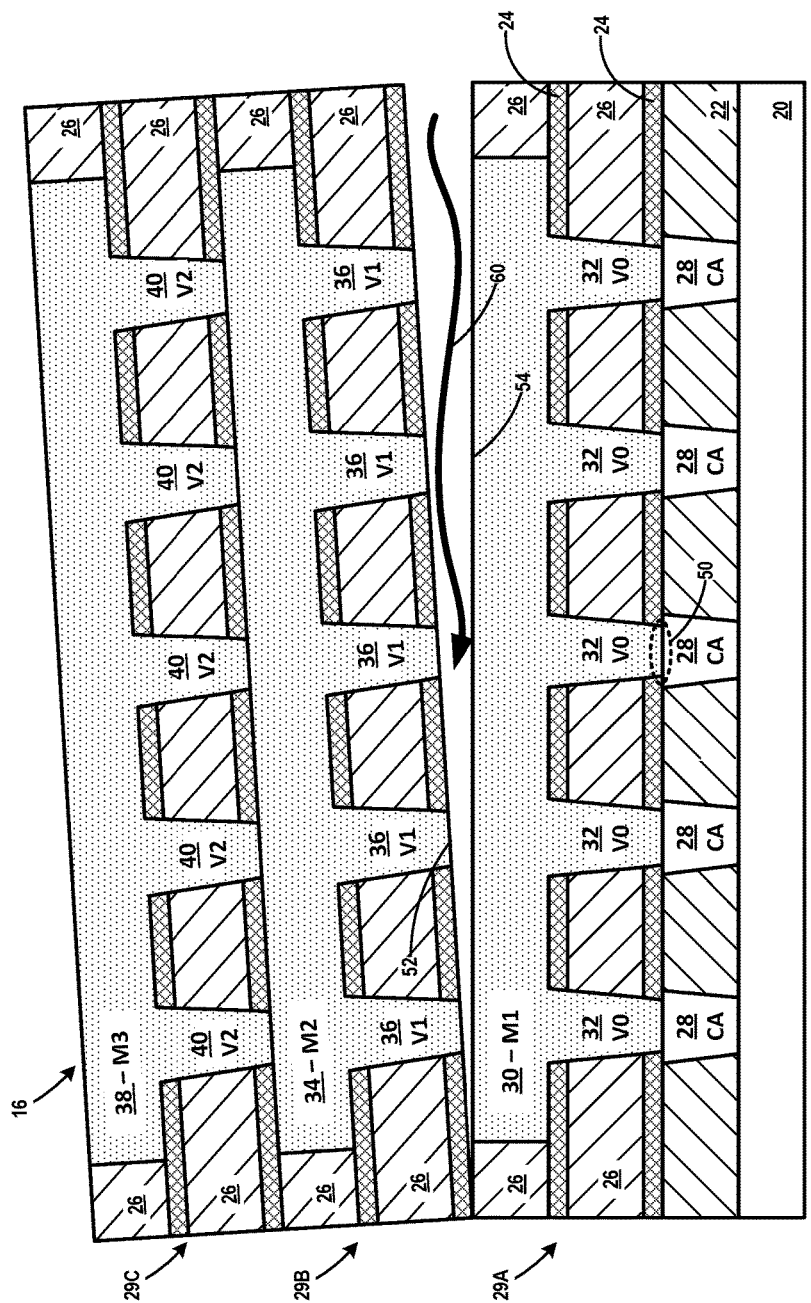

FIG. 5 depicts an example of a situation where a simplistically depicted crack 60 has caused separation between the crack-stop metallization layers 29A and 29B of the crack-stop structure 16. As depicted, the crack 60 has propagated through the crack-stop structure 16 by forcing separation along the planar interfaces 50 established between the upper planar surface 54 of the M1 metal layer 30 (of the crack-stop metallization layer 29A) and the lower planar surface 52 of the various V1 vias 36 (of the crack-stop metallization layer 29B). This mode of failure can occur between any of the metallization layers of the crack-stop structure 16. However, in some cases, this failure mode seems to be most prevalent between the crack-stop metallization layers 29A-B, and it may be particularly problematic when the IC product 10 is exposed to elevated levels of moisture relative to moisture conditions in relatively normal or standard ambient environments in which the product 10 is expected to operate.

The present disclosure generally relates to various novel crack-stop structures for an integrated circuit (IC) product and methods of making such crack-stop structures. With reference to the attached figures, various illustrative embodiments of the methods and devices disclosed herein will now be described in more detail. The methods and devices disclosed herein may be employed with any type of integrated circuit (IC) product.

Figure 6:
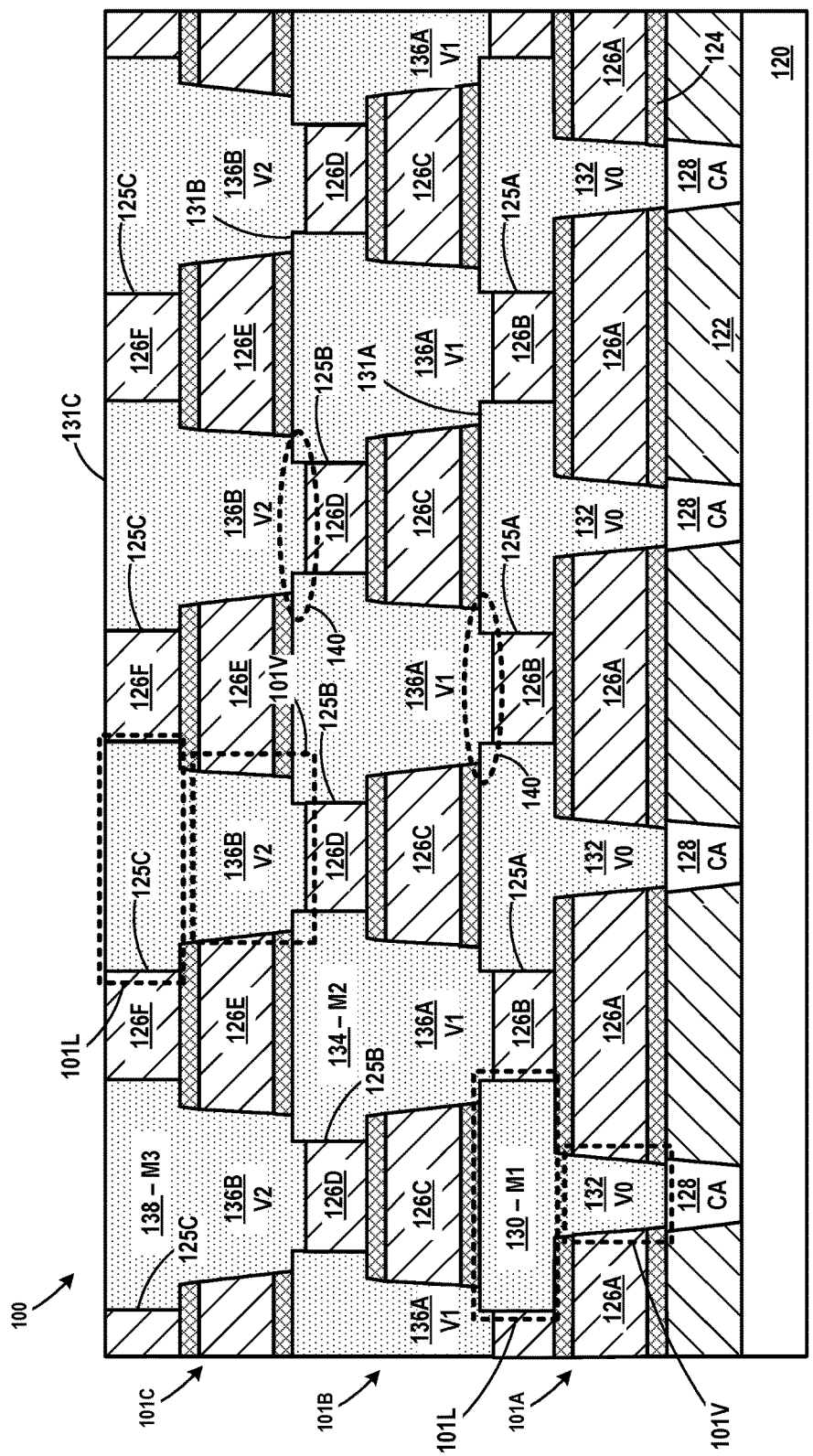
FIGS. 6-25 are drawings that depict various novel crack-stop structures disclosed herein for an IC product and methods of making such crack-stop structures.

FIGS. 6-25 are drawings that depict various novel crack-stop structures disclosed herein for an IC product and methods of making such crack-stop structures. FIG. 6 is a cross-sectional view of one illustrative embodiment of a novel crack-stop structure 100 disclosed herein. The crack-stop structure 100 is formed above a semiconductor substrate 120 around an active region (not shown) of any type of IC product. The active region of the IC product contains functioning integrated circuits that allow the IC product to perform its intended functions. In such a multiple crack-stop structure application, each of the crack-stop structures 100 need not have the same physical configuration, although that may be the case in some applications. The IC product may also include a moisture barrier (not shown) that may be arranged closer to the active region than the crack-stop structure 100. The substrate 120 may be a bulk semiconductor substrate, or it may be an SOI (Semiconductor-On-Insulator) type of substrate. The substrate 120 may be comprised of any type of semiconductor material, e.g., silicon, SiGe, germanium, etc.

The crack-stop structure 100, much like the active metallization layers formed for the functioning circuits in the active region of the IC product 100, comprises multiple metallization layers comprised of metal lines that are coupled to one another by metal via structures that are formed in insulation layers positioned between the metal layers of the crack-stop structure 100. The crack-stop structure 100 may also include a pre-metal dielectric layer disposed between the substrate 120 and the first metallization layer of the crack-stop structure 100. The crack-strop structure 100, as well as any semiconductor devices formed below the crack-stop structure 100, do not perform any electrical function for the IC product. The metal lines and vias of the crack-stop structure 100 are typically formed at the same time as the active metallization layers are formed.

With reference to FIG. 6, a layer of insulating material 122 with a plurality of device level contacts 128 (CA) positioned therein has been formed above the substrate 120. The device level contacts 128 may be, for example, conductive contacts to source/drain regions of transistor devices (not shown) that are formed under the crack-stop structure 100. Also depicted in FIG. 2 are multiple etch-stop layers 124 (e.g., silicon nitride) and multiple layers of insulating material 126A-F (collectively referenced using the reference numeral 126). The layers of insulating material 126 may be comprised of a variety of different materials, e.g., silicon dioxide, a low-k insulating material, etc.

FIG. 6 depicts the first three metallization layers 101A-C (collectively referenced using the reference numeral 101) of the crack-stop structure 100. Typically, in a real-world IC product, the crack stop structure 100 will include all of the metallization layers formed in BEOL operations. Each of the crack-stop metallization layers 101 comprise a metal line layer 101L and a via layer 101V. More specifically, in the depicted example, the crack-stop metallization layer 101A comprises the M1 metal layer 130 and a plurality of V0 vias 132, the crack-stop metallization layer 101B comprises the M2 metal layer 134 and a plurality of V1 vias 136, and the crack-stop metallization layer 101C comprises the M3 metal layer 138 and a plurality of V2 vias 136B. The vias 136A and 136B may be collectively referenced using the reference numeral 136. The metal layers and the vias may be made of any desired conductive material, e.g., copper (with associated barrier layers) and they may be formed using any desired manufacturing technique, e.g., single-damascene processing techniques, dual-damascene processing techniques, direct deposition of conductive material followed by masking an etching, etc.

Each of the metal layers (M1, M2 and M3) of the crack-stop metallization layers 101 also comprise a plurality of openings 125 formed therein. More specifically, in the depicted example, the M1 metal layer 130 has a plurality of openings 125A formed therein that extend through the M1 metal layer 130 and expose a portion of an underlying etch stop layer 124 in the crack-stop metallization layer 101A, the M2 metal layer 134 has a plurality of openings 125B formed therein that extend through the M2 metal layer 134 and expose a portion of an underlying etch stop layer 124 in the crack-stop metallization layer 101B and the M3 metal layer 138 has a plurality of openings 125C formed therein that extend through the M3 metal layer 138 and expose a portion of an underlying etch stop layer 124 in the crack-stop metallization layer 101C. The openings 125A-C may be collectively referenced using the reference numeral 125. The openings 125 may be of any desired shape or configuration (when viewed from above), e.g., square, rectangular, a plurality of linear trenches, etc. The physical size of the openings 125 as well as the number of such openings 125 in any given metal line layer 101L may also vary depending upon the application. The openings 125 may be arranged in any desired pattern or they may be formed in a random, non-repeating pattern in the metal line layers 101L of the crack-stop metallization layers 100. Moreover, the physical characteristics, the number and any pattern of the openings 125 need not be the same in each of the metal line layers 101L of the crack-stop metallization structure 100, but that may be the case in some applications. As noted above, in the depicted example, the openings 125 extend completely through the metal line layers 101L. However, in some applications, the openings 125 may only extend partially into metal line layers 101L, i.e., a timed recess etching process may be performed to form the openings 125 to a depth that is less than the thickness of the metal line layers 101L Thus, as used herein and in the attached claims, the term "opening", when referencing the openings formed in the metal line layers 101L, should be understood to cover the situation where such an opening extends completely through the metal line layer 101L as well as the situation where the opening extends only partially through the vertical thickness of the metal line layer 101L. The metal line layers 101L in the crack-stop metallization layers 101A, 101B and 101C have substantially planar upper surfaces 131A, 131B and 131C, respectively, which will be collectively referenced using the reference numeral 131.

Still referring to FIG. 6, in the depicted example, the openings 125A and 125B are partially filled with insulating material 126B and 126D. The openings 125C in the crack-stop metallization layer 101C are depicted as being completely filled with the insulating material 126F at this point in the fabrication process. As will be appreciated by those skilled in the art after a complete reading of the present application, in one illustrative embodiment, the insulating material 126F would also be recessed within the openings 125C if another crack-stop metallization layer 101 was formed above the crack-stop metallization layer 101C.

In the illustrative example depicted herein, the vias in an upper crack-stop metallization layer 101, e.g., the vias 136A in the crack-stop metallization layer 101B, extend at least partially into the openings 125 in the immediately lower-positioned crack-stop metallization layer 101, e.g., the vias 136A extend into the openings 125A in the crack-stop metallization layer 101A. Similarly, the vias 136B in the crack-stop metallization layer 101C extend at least partially into the openings 125B in the crack-stop metallization layer 101B. In the depicted example where the openings 125 are partially filled with insulating material, the interface between the vias 136 and the underlying insulating material 126 within the openings 125 is indicated in the dashed line region 140 shown in FIG. 6. As depicted, unlike the prior art crack-stop structures with substantially plate-like uniform metal line layers (like those described in the background section of this application), the metal line layers 101L of the crack-stop structure 100 comprise a plurality of the above-described openings 125. More specifically, in various embodiments of the crack-stop structure 100 disclosed herein, the above-described openings 125 in a first crack-stop metallization layer 101 (e.g., 101A) are at least partially filled by the vias in the via layer 101V of a second crack-stop metallization layer 101 (e.g., 101B) that is positioned immediately above the first crack-stop metallization layer 101.

Figure 7:
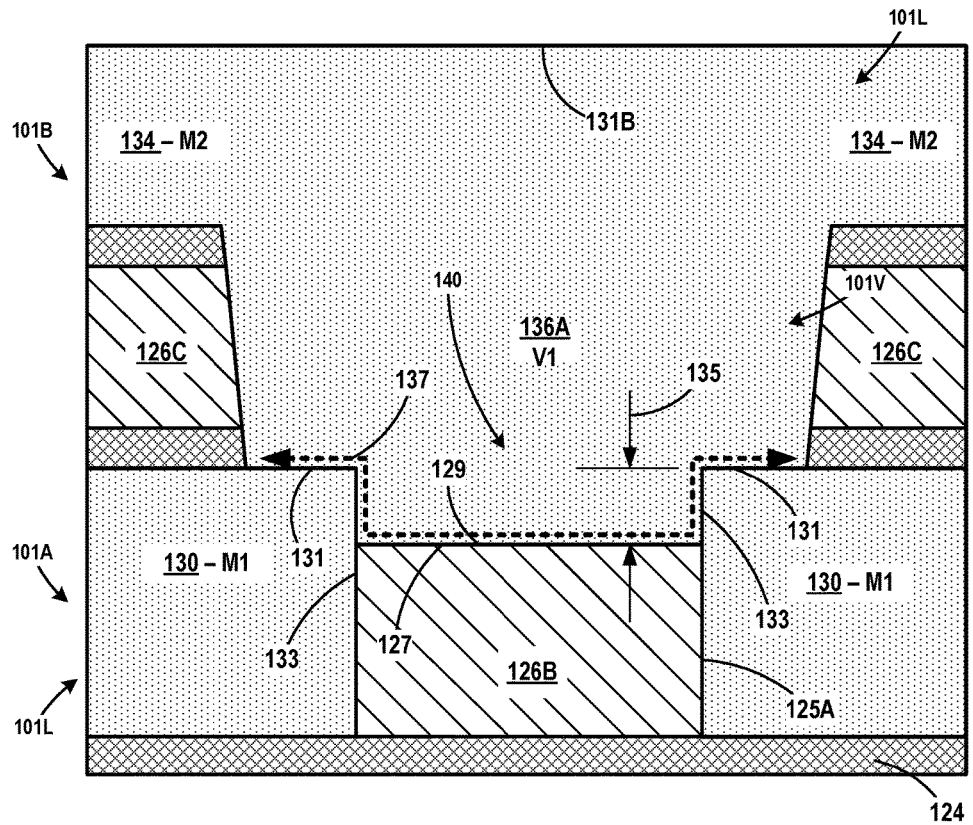
Figure 8:
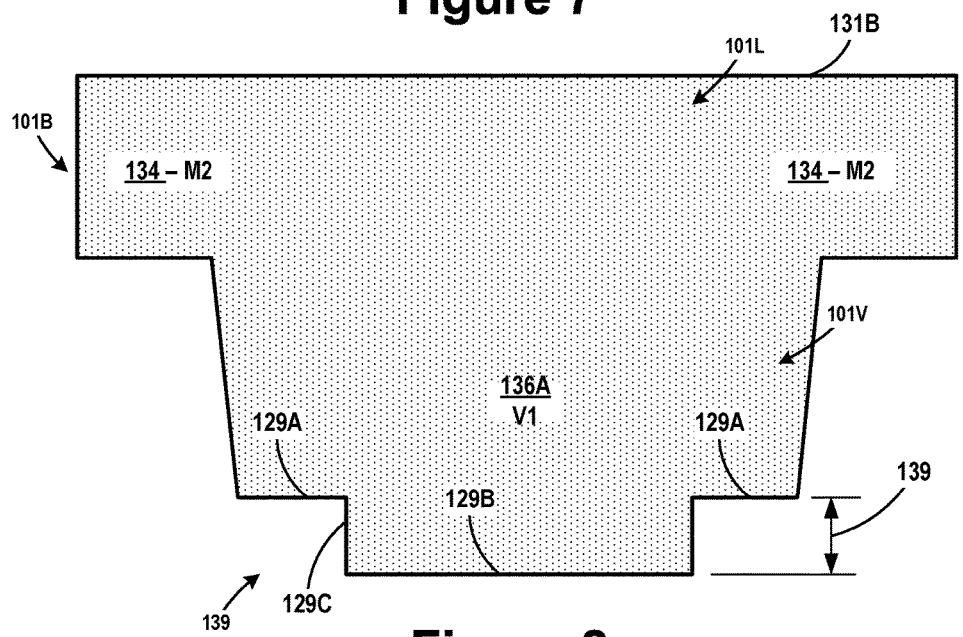

FIG. 7 is an enlarged view depicting the interface 140 between a V1 via 136A in the upper (in a relative sense) crack-stop metallization layer 101B and an opening 125A in the metal line layer 101L of the lower (in a relative sense) crack-stop metallization layer 101A. FIG. 8 is a view of just the portion of the crack-stop metallization layer 101B shown in FIG. 7. FIGS. 7 and 8 are provided to describe other aspects of various embodiments of the crack-stop structures 100 disclosed herein. As shown in FIG. 7, due to the formation of the opening 125 and the at least partial filling of the opening 125 with the via 136A, the interface 140 is a stepped, non-planar interface. That is, with reference to FIG. 8, the bottom surface 129 of the V1 via 136 is a stepped bottom surface comprised of generally horizontally oriented surfaces 129A and 129B. The stepped, non-planar interface 140 of the crack-stop structure 100 disclosed herein is in stark contrast to the planar interface 50 between the surface 52 of the V1 via 36 and the upper surface 54 of the continuous M1 metal layer 30 in the prior art cracks-stop structure 16 shown in FIG. 5. With reference to FIG. 7, the stepped, non-planar interface 140 defines a non-planar tortuous path 137 for a crack to propagate from left to right (or vice versa) in FIG. 7. Thus, the stepped, non-planar interface 140 provides greater resistance to crack propagation as compared to prior art crack-stop structures having a substantially planar interface between the vias in an upper (in a relative sense) crack-stop metallization layer and a substantially continuous metal layer in a lower (in a relative sense) crack-stop metallization layer.

As depicted, the substantially planar surfaces 129A contact and engage portions of the substantially planar upper surface 131 of the M1 metal layer 130 while another planar surface 129B engages the recessed upper surface 127 of the insulating material 126B positioned within the opening 125A. Also note that vertically oriented portions 129C of via 136A also contact portions of the sidewalls 133 of the opening 125 above the recessed upper surface 127 of the insulating material 126B. The depth 135 of the recessing of the insulating material 126B may vary depending upon the particular application. Due to the recessing of the insulating material 126B, the via 136A comprises a corresponding extended portion 139 that is positioned within the opening 125A above the insulating material 126B.

In one illustrative embodiment, the via 136A is sized and configured such that the stepped bottom surface 129 of the via 136A has a larger footprint (horizontal) area (the combination of the surfaces 129A and 129B) than the footprint (horizontal) area of the opening 125A. More specifically, the area of the insulating materials for the via 136A at or near the upper surface 131 of the M1 metal layer 130 will be greater than the area of the opening 125A such that the portions 129A of the bottom surface of the via 136A land on the M1 metal layer 130. In some applications, the horizontally oriented portions 129A of the via 136A land on the upper surface 131 of the M1 metal layer 130 around the entire perimeter of the opening 125A, but that may not be the case in all applications. However, in some applications, as discussed more fully below, the openings 125 may be substantially free of any insulation material 126 and may be substantially completely filled with the extension 139 of the via 136A.

Figure 9:
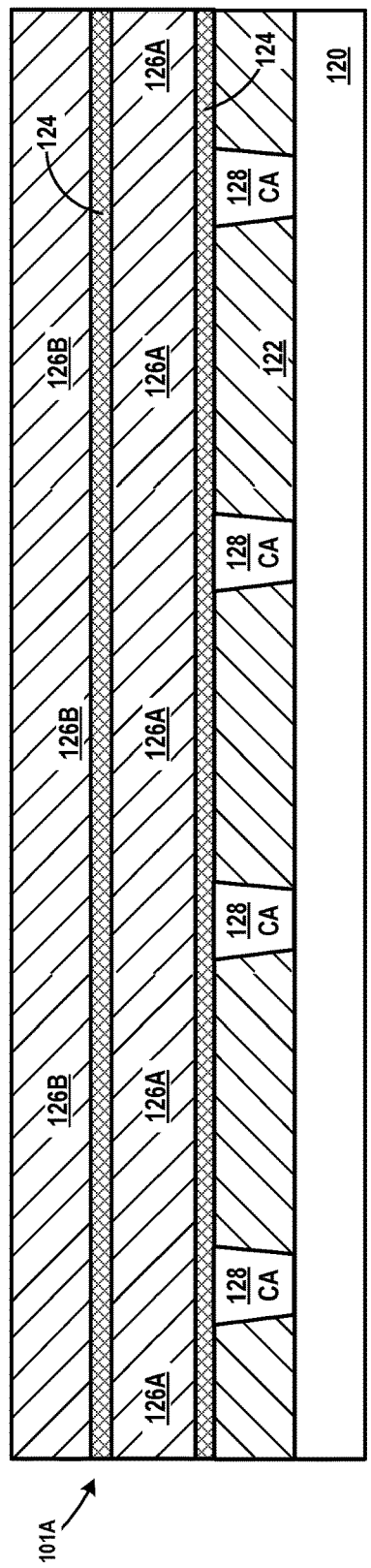

One illustrative method of making one embodiment of a crack-stop structure 100 using a double-damascene processing technique will now be described. FIG. 9 depicts the crack-stop structure 100 after several processing operations were performed. First, various semiconductor devices (not shown), such as transistors, capacitors, resistors and the like, were formed in and above the substrate 120 below the insulation layer 122 shown in FIG. 9. As noted above, the semiconductor devices formed below the crack-stop structure 100 typically serve no electrical function as it relates to the performance of the IC product. Next, the insulating layer 122 and the device level contacts 128 were formed above the semiconductor devices. Thereafter, the insulating material layers 126A, 126B and corresponding etch stop layers 124 of the crack-stop metallization layer 101A were formed above the insulating material 122.

Figure 10:
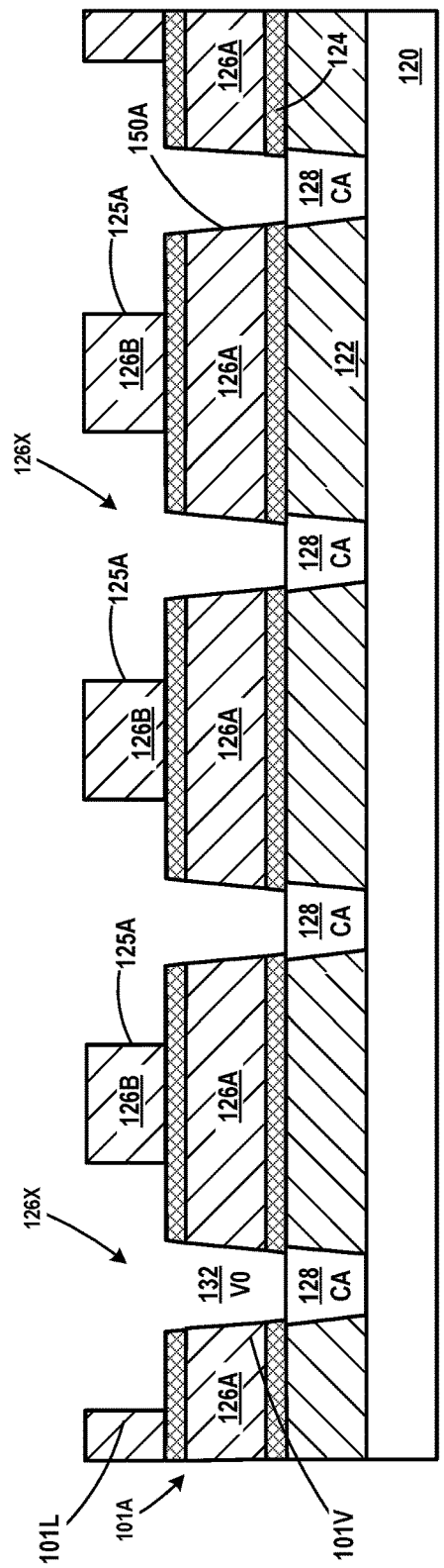

FIG. 10 depicts the crack-stop structure 100 after one or more masking layers and multiple etching processes were performed to define a plurality of via openings 150A in the insulating material layer 126A and the etch stop layers 124 and a plurality of metal line openings 126X were formed in the insulating material 126B. As will be appreciated by those skilled in the art after a complete reading of the present application, the "islands" of insulating material 126B will correspond to the openings 125A that will be defined in the M1 metal layer 130 that will be formed in the metal line openings 126X in the layer of insulating material. As depicted, formation of the via openings 150A expose the underlying device level contacts 128.

Figure 11:
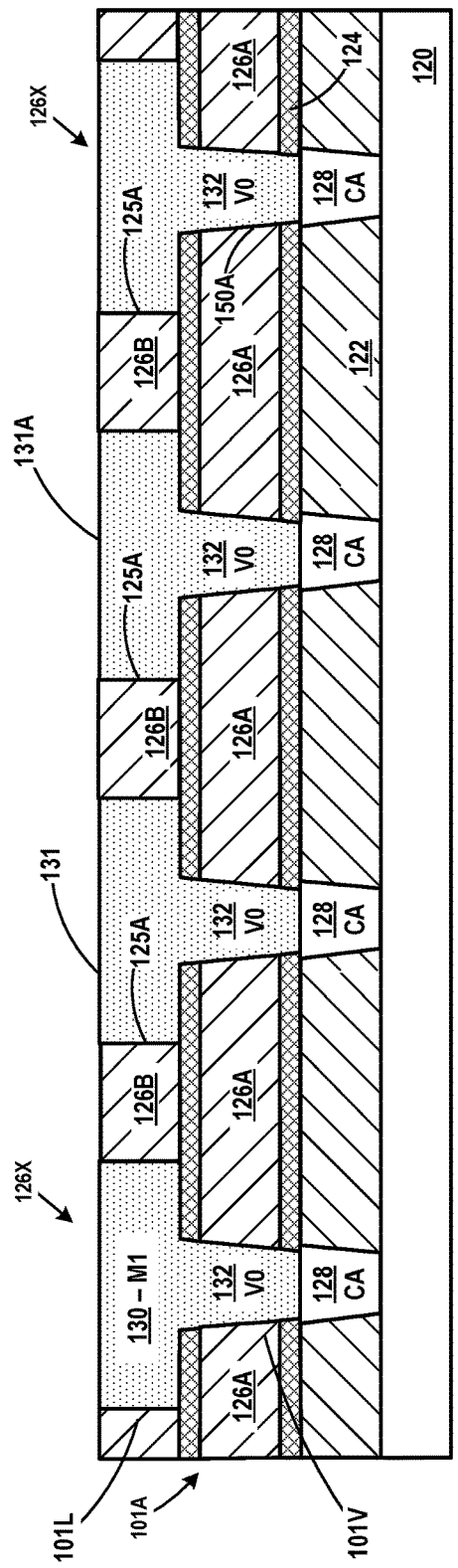

FIG. 11 depicts the crack-stop structure 100 after several process operations were performed. First, one or more conductive materials, e.g., barrier liner layers, a bulk conductive material, such as copper, were formed so as to overfill the via openings 150A and the metal line openings 126X. Thereafter, one or more planarization process operations, such as CMP operations, were performed so as to remove excess amounts of the conductive material positioned above the upper surface of the patterned insulating material layer 126B. This results in the formation of the via layer 101V (comprised of a plurality of vias 132) and the metal line layer 101L (with a plurality of openings 125A defined therein) of the crack-stop metallization layer 101A.

Figure 12:
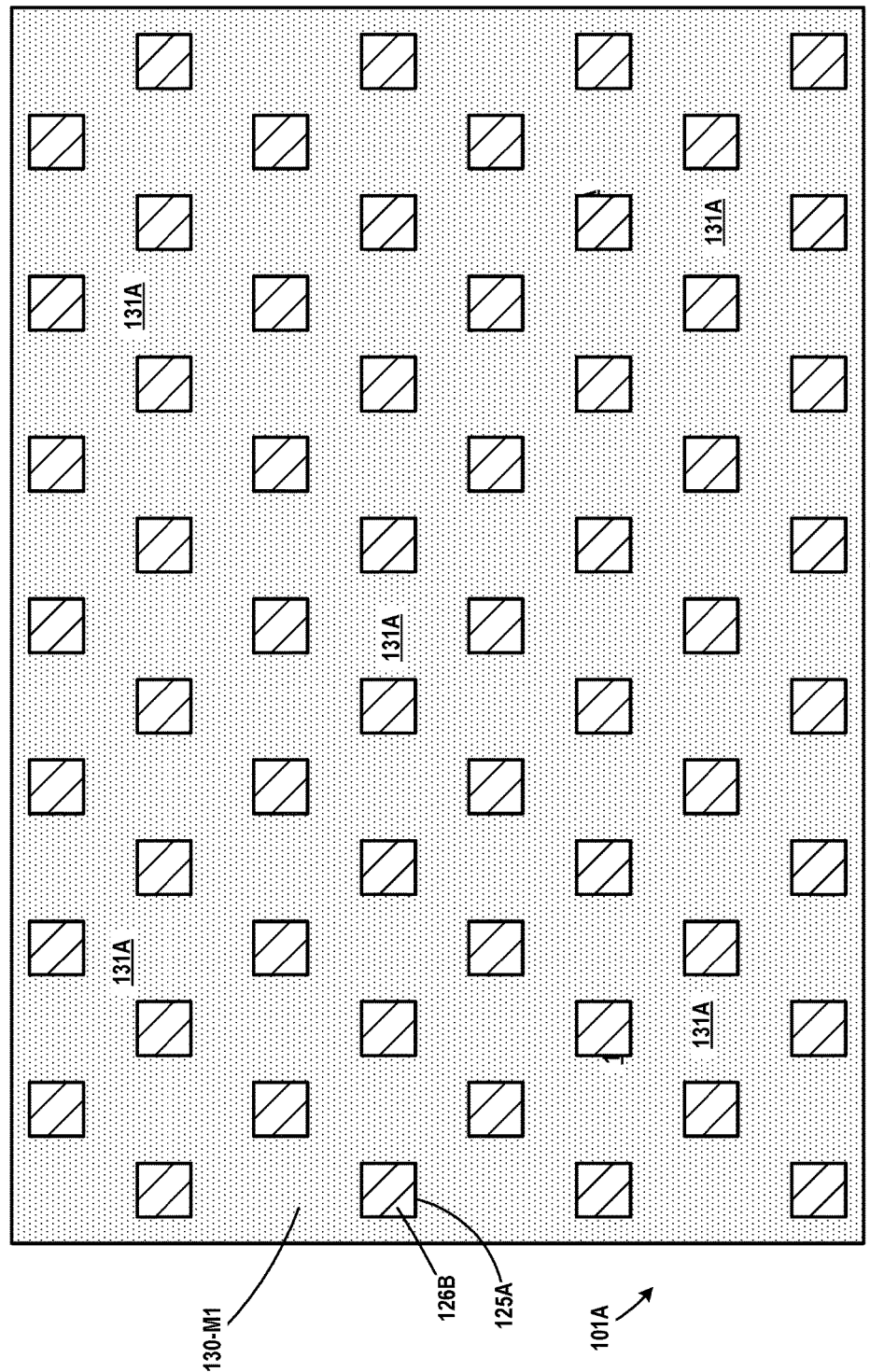

FIG. 12 is a plan view of the crack-stop structure 100 at the point of processing depicted in FIG. 11. The upper surface 131A of the M1 metal layer 130 is depicted in FIG. 12. In this example, the openings 125A have a substantially square configuration (when viewed from above). As noted above, the number, spacing and pattern of the openings 125 in any of the crack-stop metallization layers 101 may vary depending upon the particular application.

Figure 13:
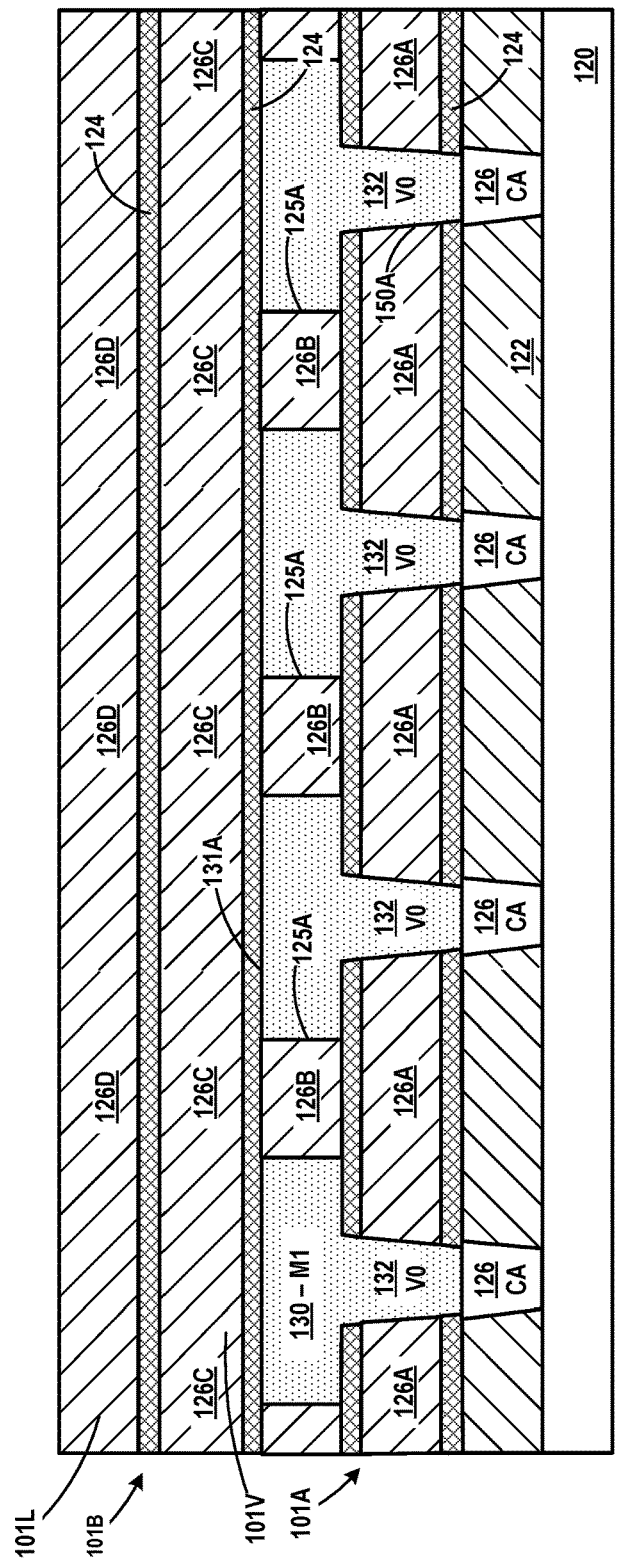

FIG. 13 depicts the crack-stop structure 100 after the insulating material layers 126C, 126D and corresponding etch stop layers 124 of the crack-stop metallization layer 101B were formed above the crack-stop metallization layer 101A.

Figure 14:
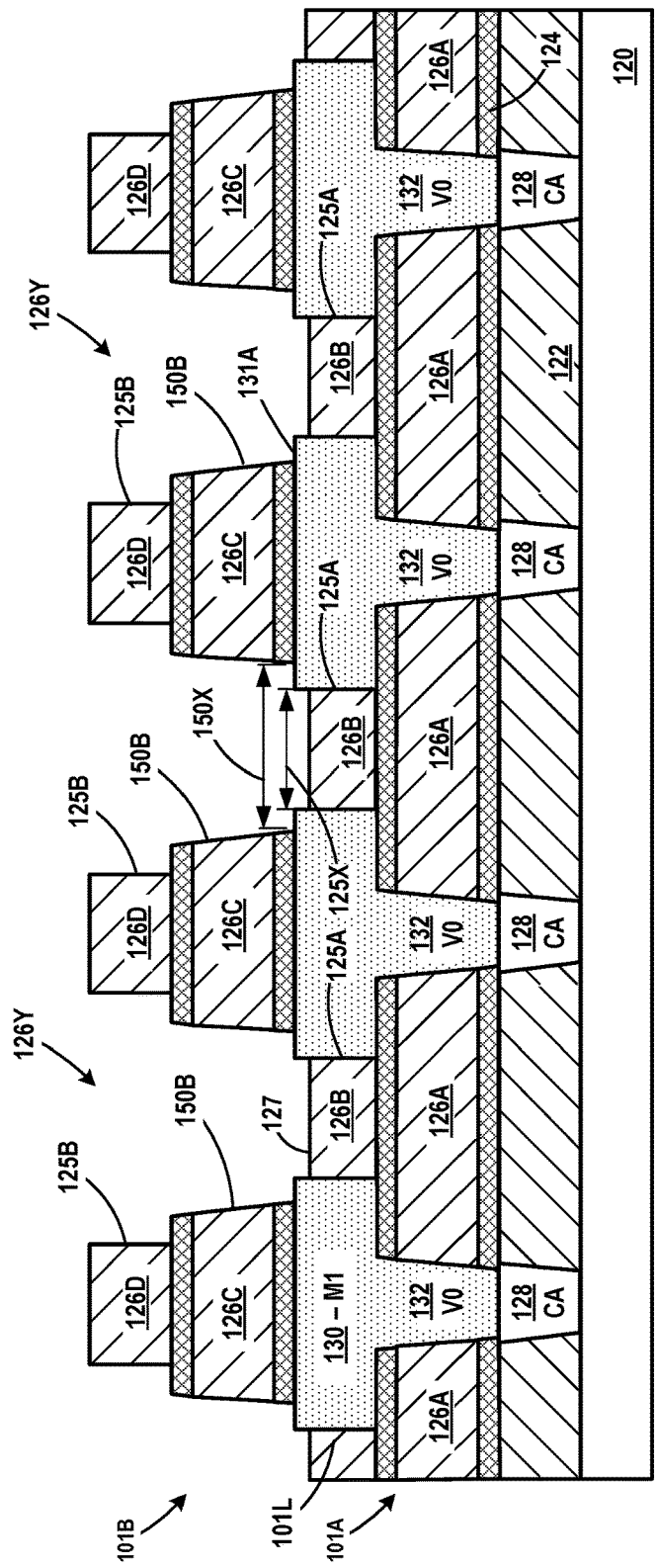

FIG. 14 depicts the crack-stop structure 100 after one or more masking layers and multiple etching processes were performed to define a plurality of via openings 150B in the insulating material layer 126C and the etch stop layers 124 and a plurality of metal line openings 126Y were formed in the insulating material 126D. As will be appreciated by those skilled in the art after a complete reading of the present application, the "islands" of insulating material 126D will correspond to the openings 125B that will be defined in the M2 metal layer 134 that will be formed in the metal line openings 126Y in the layer of insulating material 126D. As depicted, formation of the via openings 150B exposes the openings 125A in the M1 metal layer 130 of the crack-stop metallization layer 101A. In the depicted example, formation of the via openings 150B results in a partial recessing of the insulating material 126B positioned in the openings 125A, as reflected by the recessed upper surface 127. As discussed above, in one embodiment, the area of the via openings 150B is larger than the area defined by the openings 125A such that the subsequently formed via will overlay the openings 125A. Thus, as shown in FIG. 14, the via openings 150B have a lateral width 150X near the upper surface 131A of the M1 metal layer 130 that is greater than a corresponding lateral dimension 125X of the openings 125A.

Figure 15:
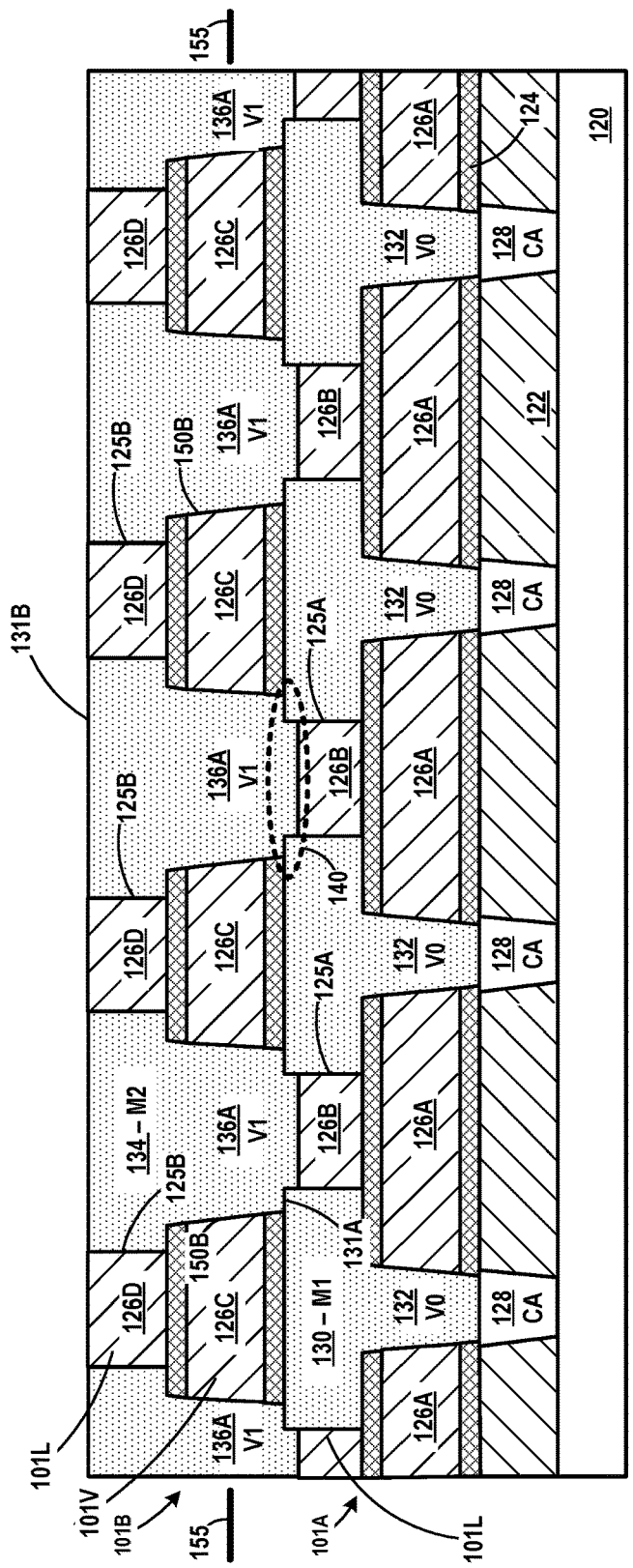

FIG. 15 depicts the crack-stop structure 100 after several process operations were performed. First, one or more conductive materials, e.g., barrier liner layers, a bulk conductive material, such as copper, were formed so as to overfill the via openings 150B and the metal line openings 126Y. Thereafter, one or more planarization process operations, such as CMP operations, were performed so as to remove excess amounts of the conductive material positioned above the upper surface of the patterned insulating material layer 126D. This results in the formation of the via layer 101V (comprised of a plurality of vias 136A) and the metal line layer 101L (with a plurality of openings 125B defined therein) of the crack-stop metallization layer 101B. As indicated, this results in the formation of the above-described stepped, non-planar interface 140 between the vias 136A and the underlying crack-stop metallization layer 101A by virtue of the vias 136A at least partially filling the openings 125A. Note that, in the novel crack-stop structure 100 disclosed herein, the pattern of the vias 136A is intentionally selected such that the vias 136A will land on and overlay the openings 125A. In one example depicted herein, the openings 125A are partially filled with the insulating material 126B. At least some design rules for manufacturing IC products mandate that vias cannot land on insulating material, i.e., the via must "fully land" on an underlying conductive structure, such as a device level contact or a metal line. Thus, the novel crack-stop structure 100 disclosed herein runs counter to such established design rules for the formation of vias so as to produce a more robust crack-stop structure 100 with the above-described stepped, non-planar interface 140 between adjacent crack-stop metallization layers 101. In the example depicted in FIG. 14, the etching processes performed to form the via openings 150B were performed such that some of the insulating material 126B remains positioned within the openings 125A as indicated by the recessed upper surface 127. However, as noted above, if desired, the etching process could be continued so as to remove substantially all of the insulating material 126B from the openings 125A, although this situation is not depicted in FIG. 14.

Figure 16:
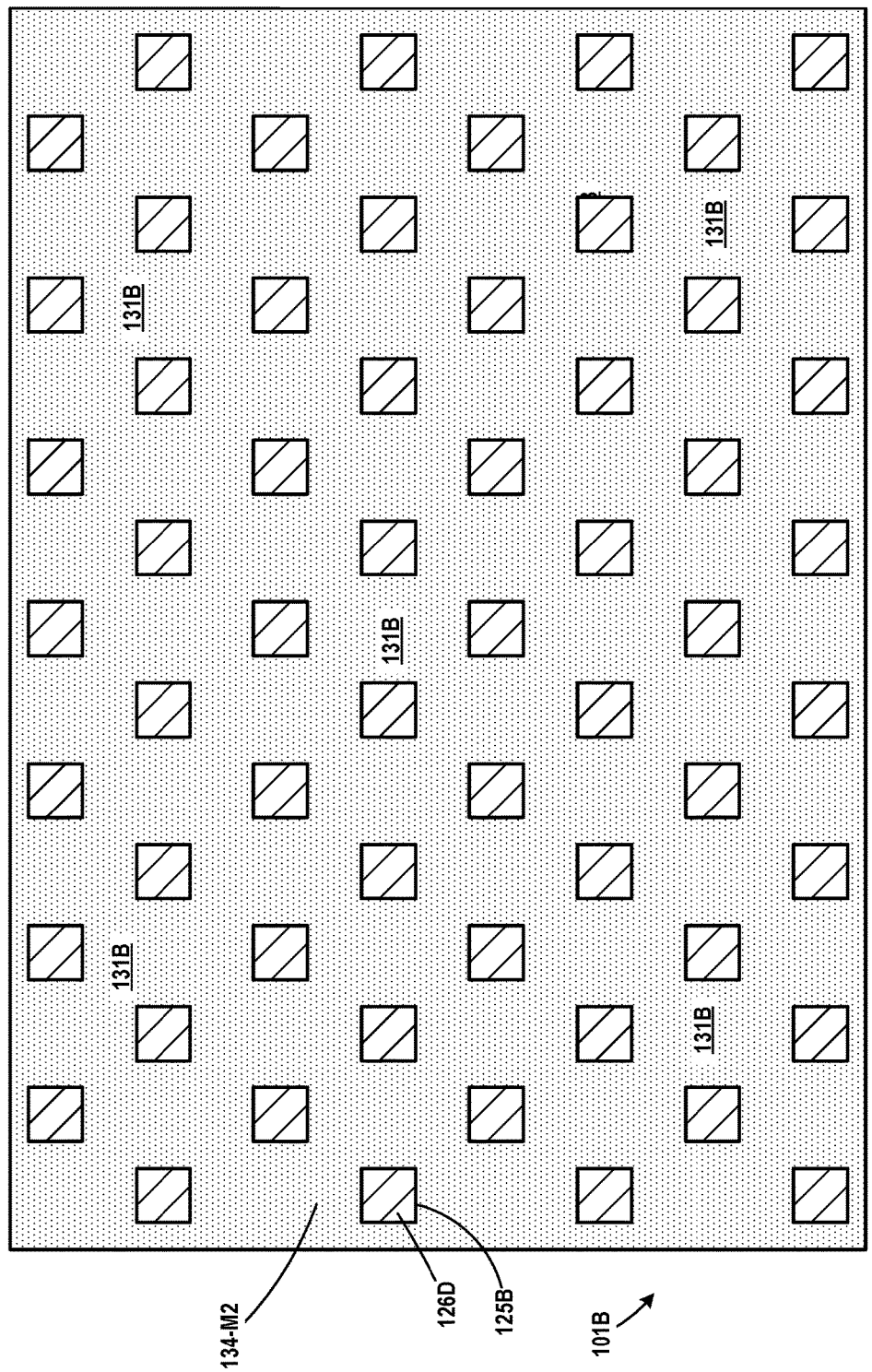

FIG. 16 is a plan view of the crack-stop structure 100 at the point of processing depicted in FIG. 15. The upper surface 131B of the M2 metal layer 134 is depicted in FIG. 16. In this example, the openings 125B have a substantially square configuration (when viewed from above). As noted above, the number, spacing and pattern of the openings 125 in any of the crack-stop metallization layers 101 may vary depending upon the particular application.

Figure 17:
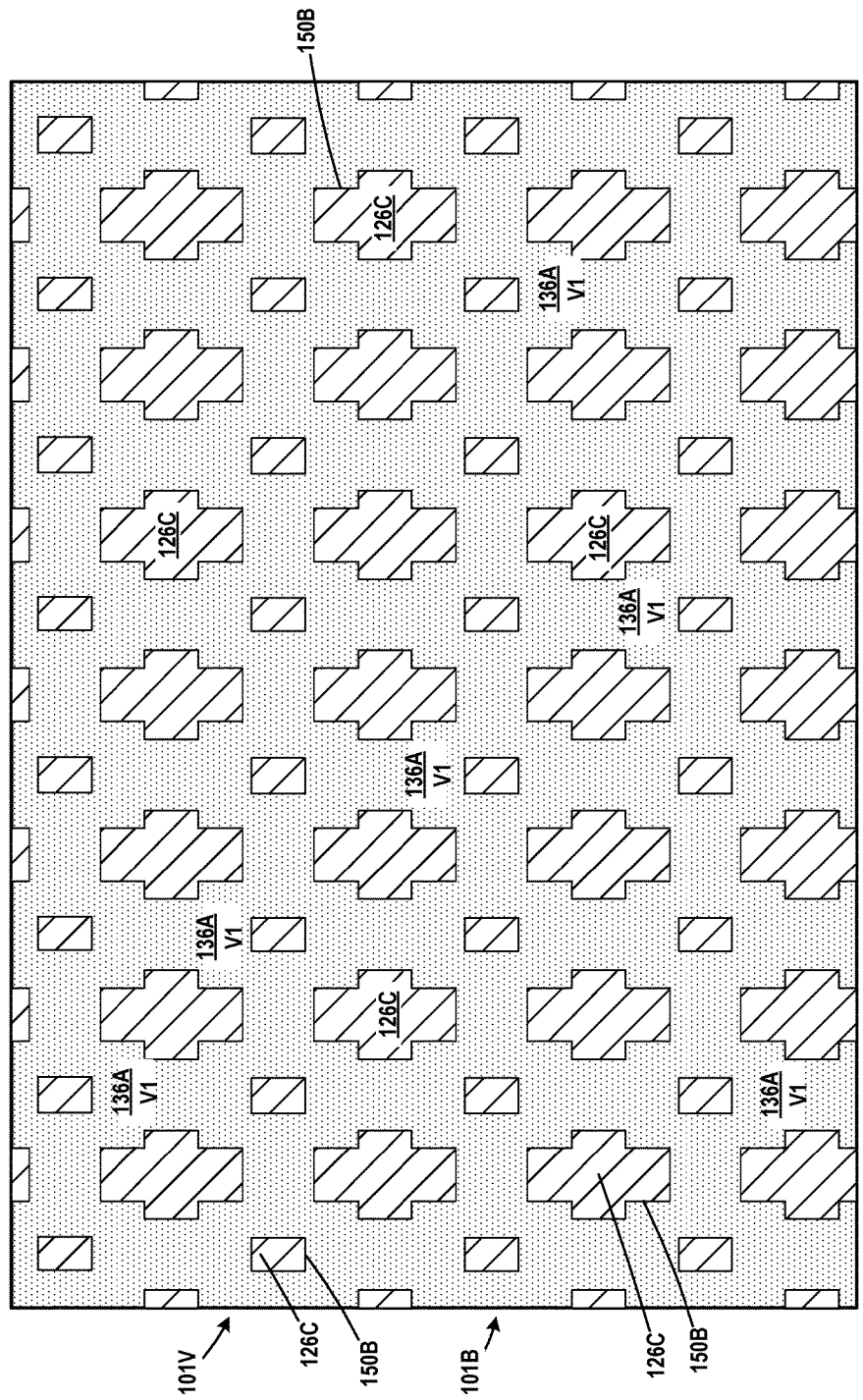
Figure 18:
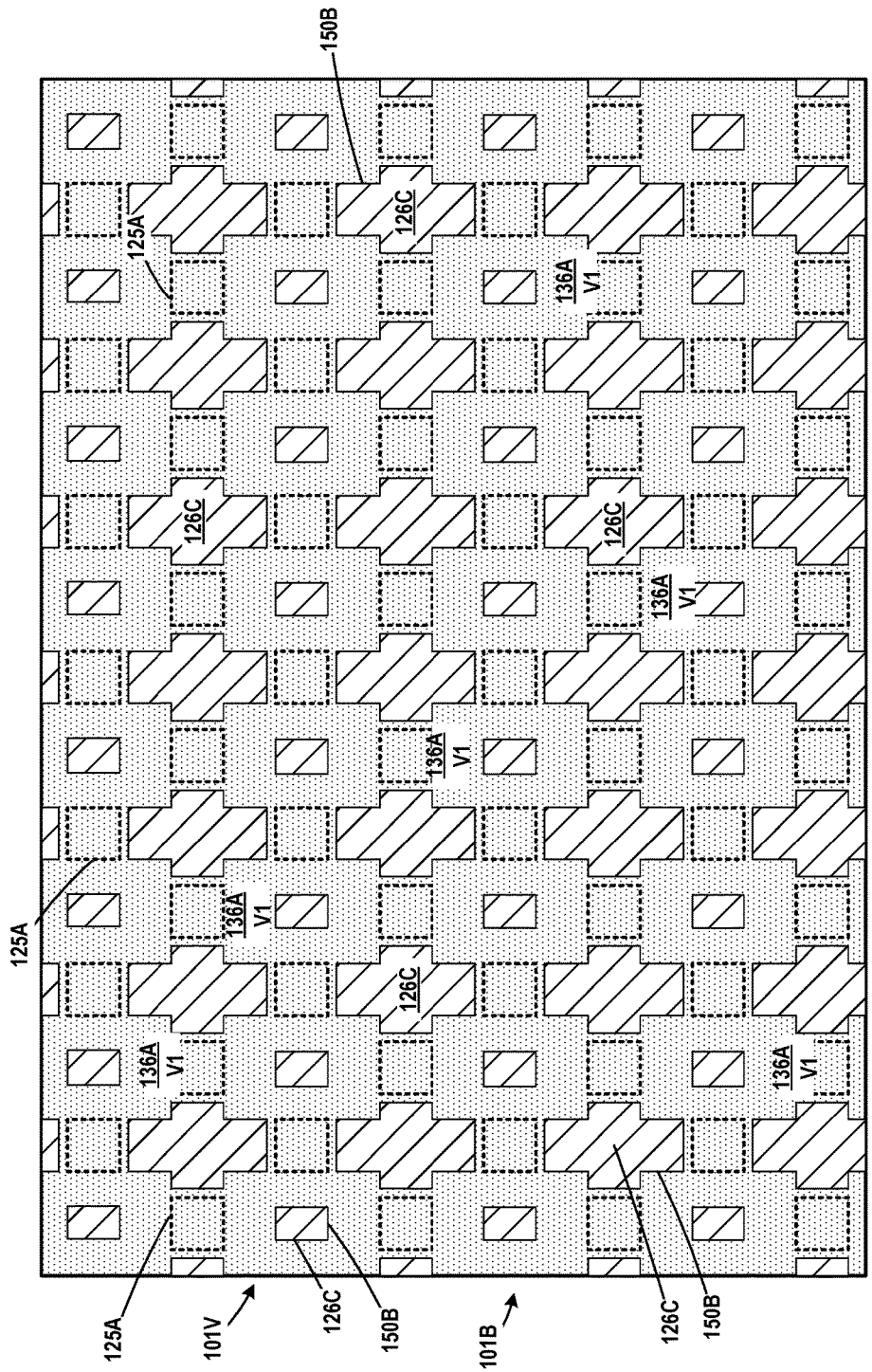
Figure 19:
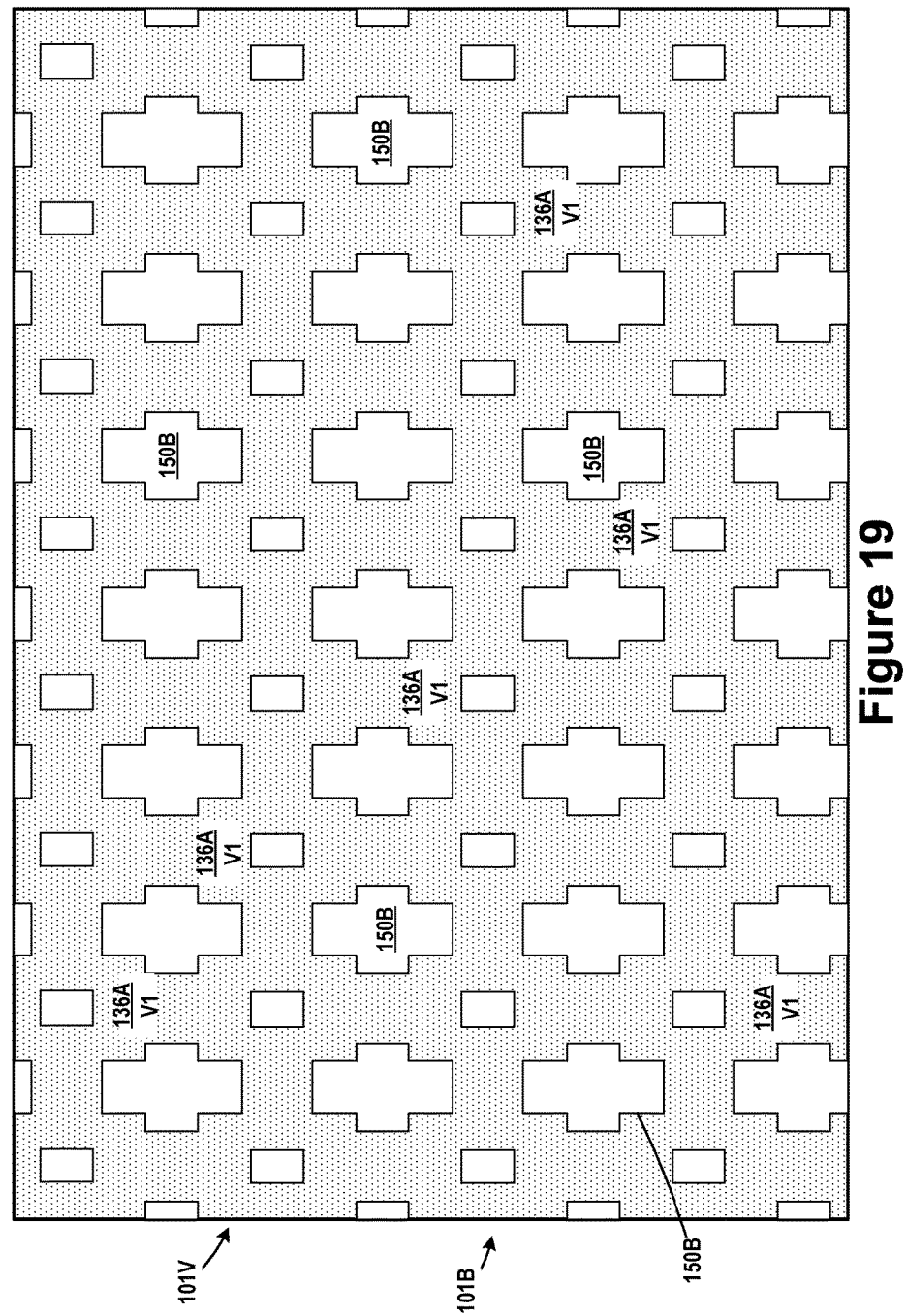

FIGS. 17-19 are plan views taken through the via level 101V of the crack-stop metallization layer 101B at the level depicted by the line 155 in FIG. 15. FIG. 17 depicts the V1 vias 136A and the islands of insulating material 126C that are formed in the via openings 150B. FIG. 18 is the same as FIG. 17 except that the location of the openings 125A in the underlying M1 metal layer 130 of the crack-stop metallization layer 101A are depicted in dashed lines. As indicated, the V1 vias 136A land and cover the openings 125A. FIG. 19 is a view of just the actual via layer 101V of the crack-stop metallization layer 101B with all of the insulation material omitted.

Figure 20:
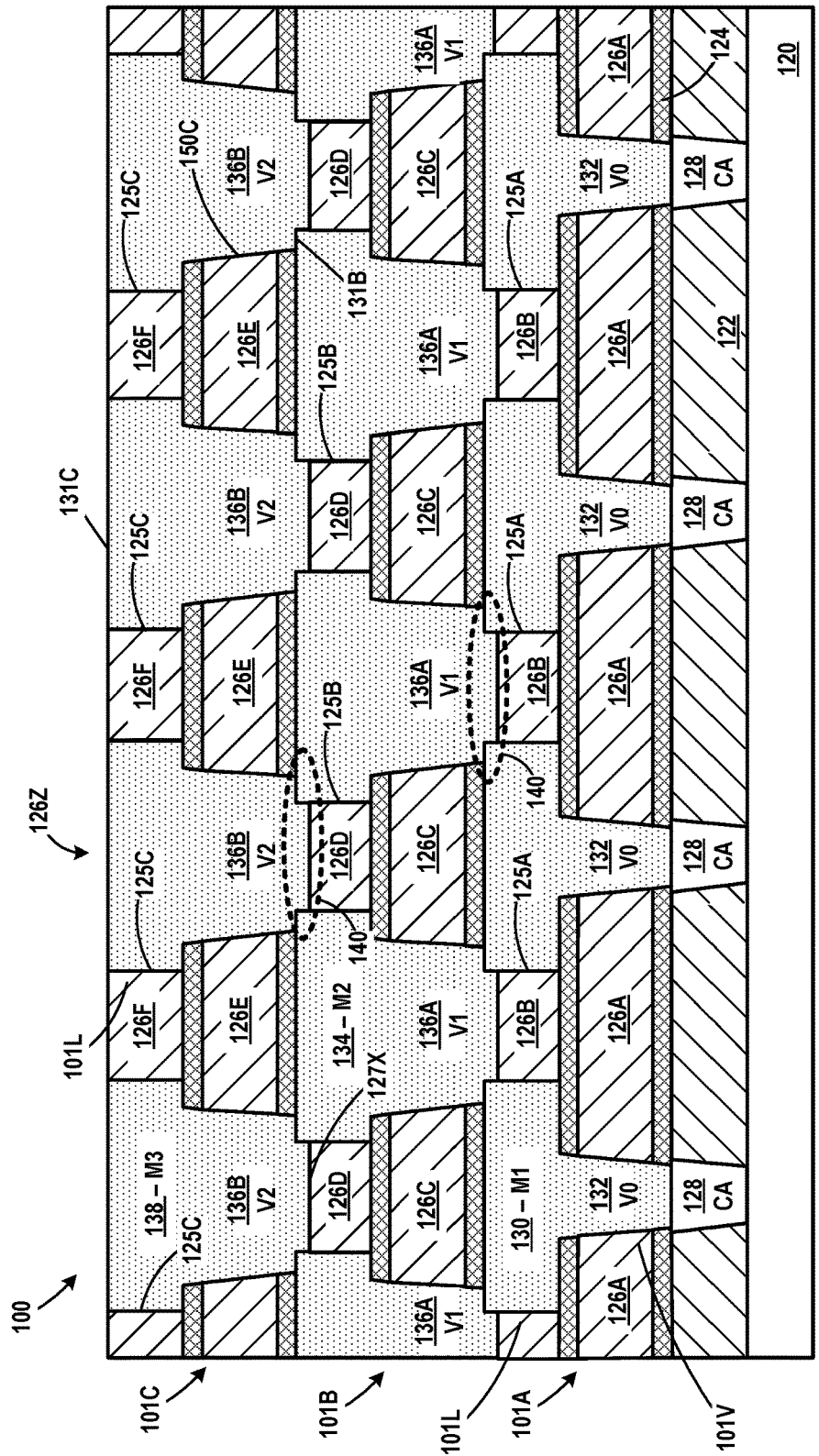

FIG. 20 depicts the crack-stop structure 100 after several process operations described above were repeated for the crack-stop metallization layer 101C above the crack-stop metallization layer 101B. First, the insulating material layers 126E, 126F and corresponding etch stop layers 124 of the crack-stop metallization layer 101C were formed above the crack-stop metallization layer 101B. Thereafter, one or more masking layers and multiple etching processes were performed to define a plurality of via openings 150C in the insulating material layer 126E and the etch stop layers 124 and a plurality of metal line openings 126Z were formed in the insulating material 126F. As will be appreciated by those skilled in the art after a complete reading of the present application, the "islands" of insulating material 126F will correspond to the openings 125C that will be defined in the M3 metal layer 138 that will be formed in the metal line openings 126Z in the layer of insulating material 126F. As depicted, formation of the via openings 150C exposes the openings 125B in the M2 metal layer 134 of the crack-stop metallization layer 101B. In the depicted example, formation of the via openings 150C results in a partial recessing of the insulating material 126D positioned in the openings 125B, as reflected by the recessed upper surface 127X. As discussed above, in one embodiment, the area of the via openings 150C is larger than the area defined by the openings 125B such that the subsequently formed via will overlay the openings 125B. Thus, like the vias shown in FIG. 14, the via openings 150C have a lateral width 150X near the upper surface 131B of the M2 metal layer 134 that is greater than a corresponding lateral dimension 125X of the openings 125B. Then, one or more conductive materials, e.g., barrier liner layers, a bulk conductive material, such as copper, were formed so as to overfill the via openings 150C and the metal line openings 126Z. Thereafter, one or more planarization process operations, such as CMP operations, were performed so as to remove excess amounts of the conductive material positioned above the upper surface of the patterned insulating material layer 126F. This results in the formation of the via layer 101V (compriseD of a plurality of vias 136B) and the metal line layer 101L (with a plurality of openings 125C defined therein) of the crack-stop metallization layer 101C. As indicated, this results in the formation of the above-described stepped, non-planar interface 140 between the vias 136B and the underlying crack-stop metallization layer 101B by virtue of the vias 136B at least partially filling the openings 125B. As before, the pattern of the vias 136B is intentionally selected such that the vias 136B will land on and overlay the openings 125B. At this point, additional crack-stop metallization layers 101 may be formed above the crack-stop metallization layer 101C using the methods disclosed herein.

Figure 21:
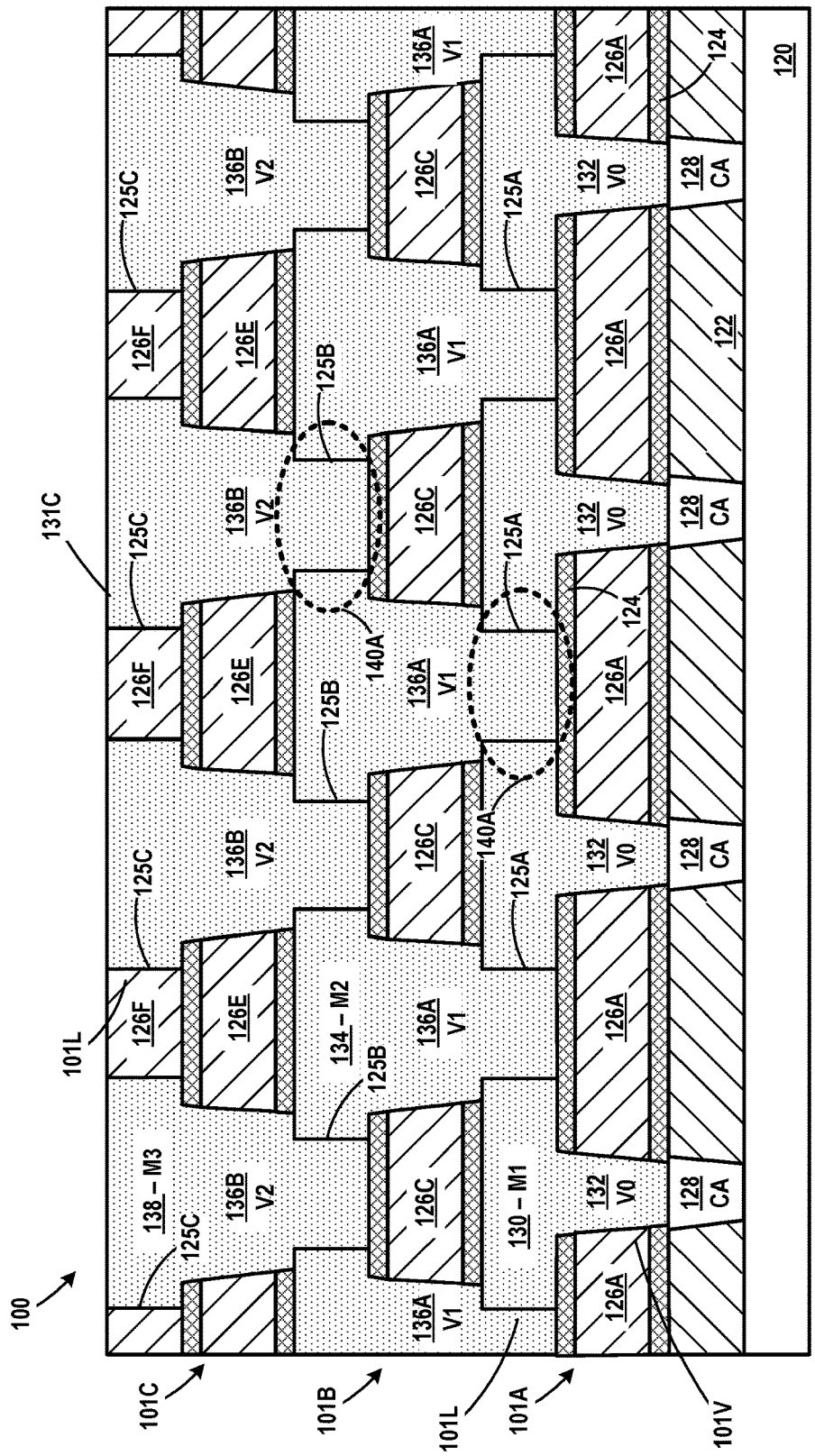

FIG. 21 depicts an alternative embodiment wherein the insulating materials 126B, 126D were substantially completely removed from the openings 125A, 125B, respectively, and wherein a portion of the vias 136A and 136B fill substantially the entirety of the openings 125A, 125B, respectively.

Figure 22:
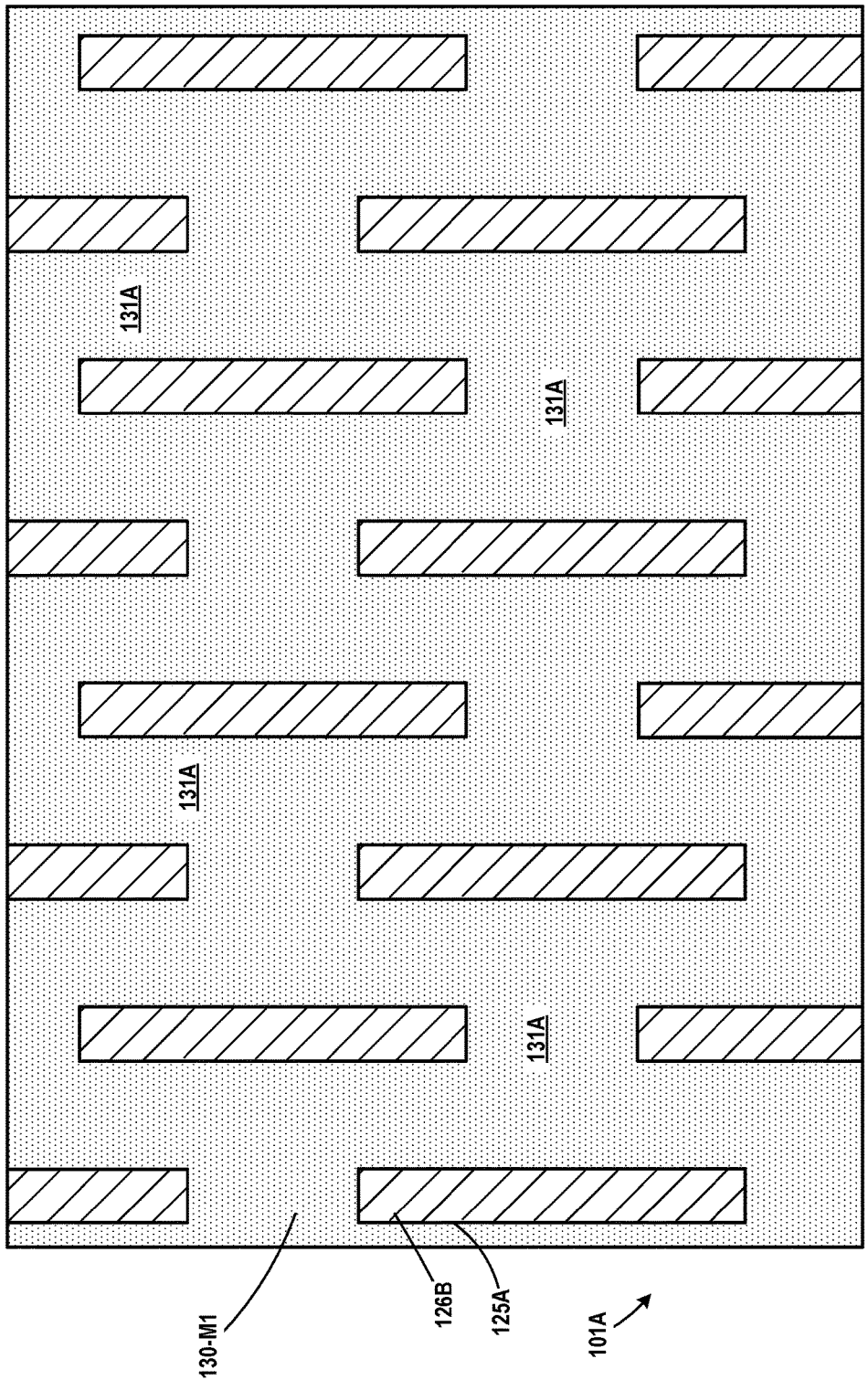
Figure 23:
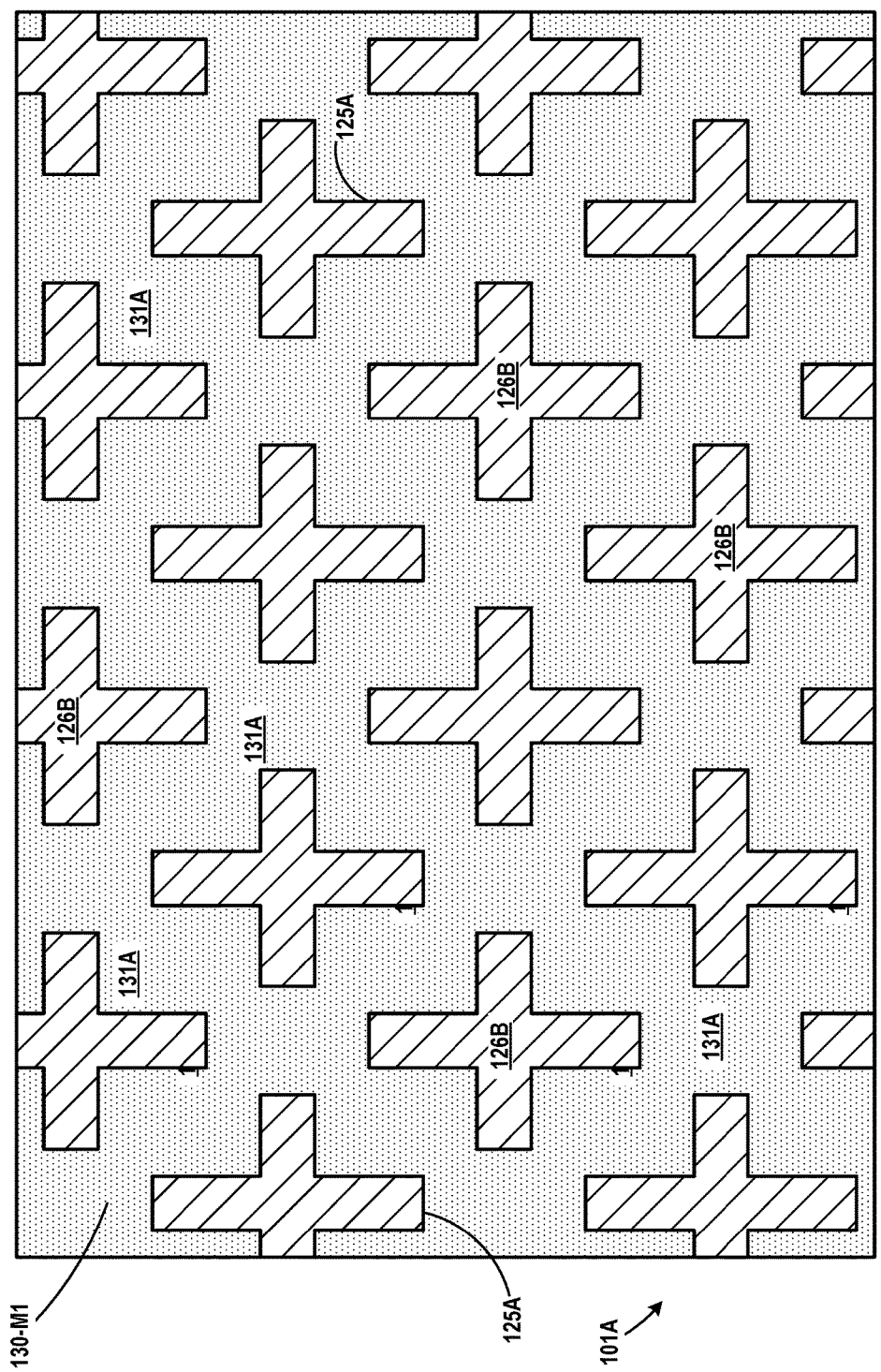

As noted above, the shape, size, number, configuration and pattern (if any) of the openings 125 form in the metal line layers 101L of the crack-stop metallization layer 101 may vary depending upon the particular application, and the size, number, configuration and pattern (if any) of the openings formed in other crack-stop metallization layers 101 of the crack-stop structure 100 need not be the same, although that may be the case in some applications. FIG. 22 depicts an example of the crack-stop structure 100 wherein the openings 125A in the M1 metal layer 130 of the crack-stop metallization layer 101A have the configuration of an elongated trench as compared to the approximately square shaped configuration of the openings 125A shown in FIG. 12. Of course, the illustrative configuration of the openings 125A shown in FIG. 22 may be used at any or all of the crack-stop metallization layers 101 of the crack-stop structure 100. FIG. 23 depicts yet another embodiment wherein the openings 125A in the M1 metal layer 130 of the crack-stop metallization layer 101A have a cross-shaped configuration (when viewed from above). As before, the illustrative cross-shaped configuration of the openings 125A shown in FIG. 23 may be used at any or all of the crack-stop metallization layers 101 of the crack-stop structure 100.

Figure 24:
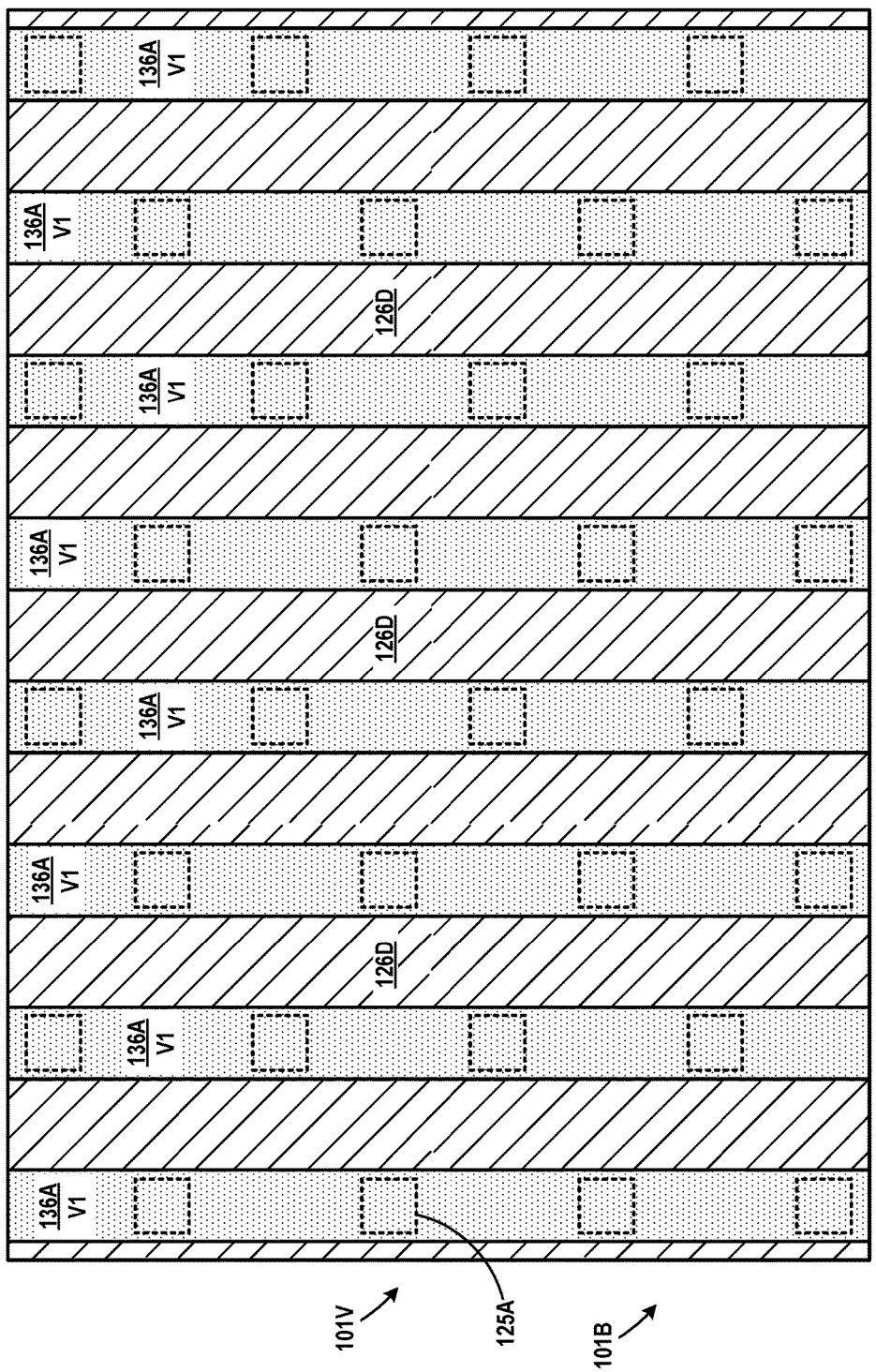

Similarly, the shape, size and configuration of the conductive vias (in whatever crack-stop metallization layer 101 of the crack-stop structure 100) may also vary depending upon the particular applications. For example, FIG. 24 depicts an embodiment of the crack-stop metallization layer 101B wherein the V1 vias 136A in the via level 101V of the crack-stop metallization layer 101B are a plurality of individual line-type structures that are formed over a plurality of the openings 125A in the M metal layer 130 of the crack-stop metallization layer 101A. Note that the pattern of the openings 125A shown in FIG. 24 is less dense than the pattern of the openings 125A shown in FIG. 12. Also note that, if desired, the openings 125A in FIG. 12 or FIG. 24 could be a plurality of spaced-apart substantially continuous line-type structures (i.e., continuous trenches) that follow the overall rectangular or square configuration of the crack-stop structure 100.

Figure 25:
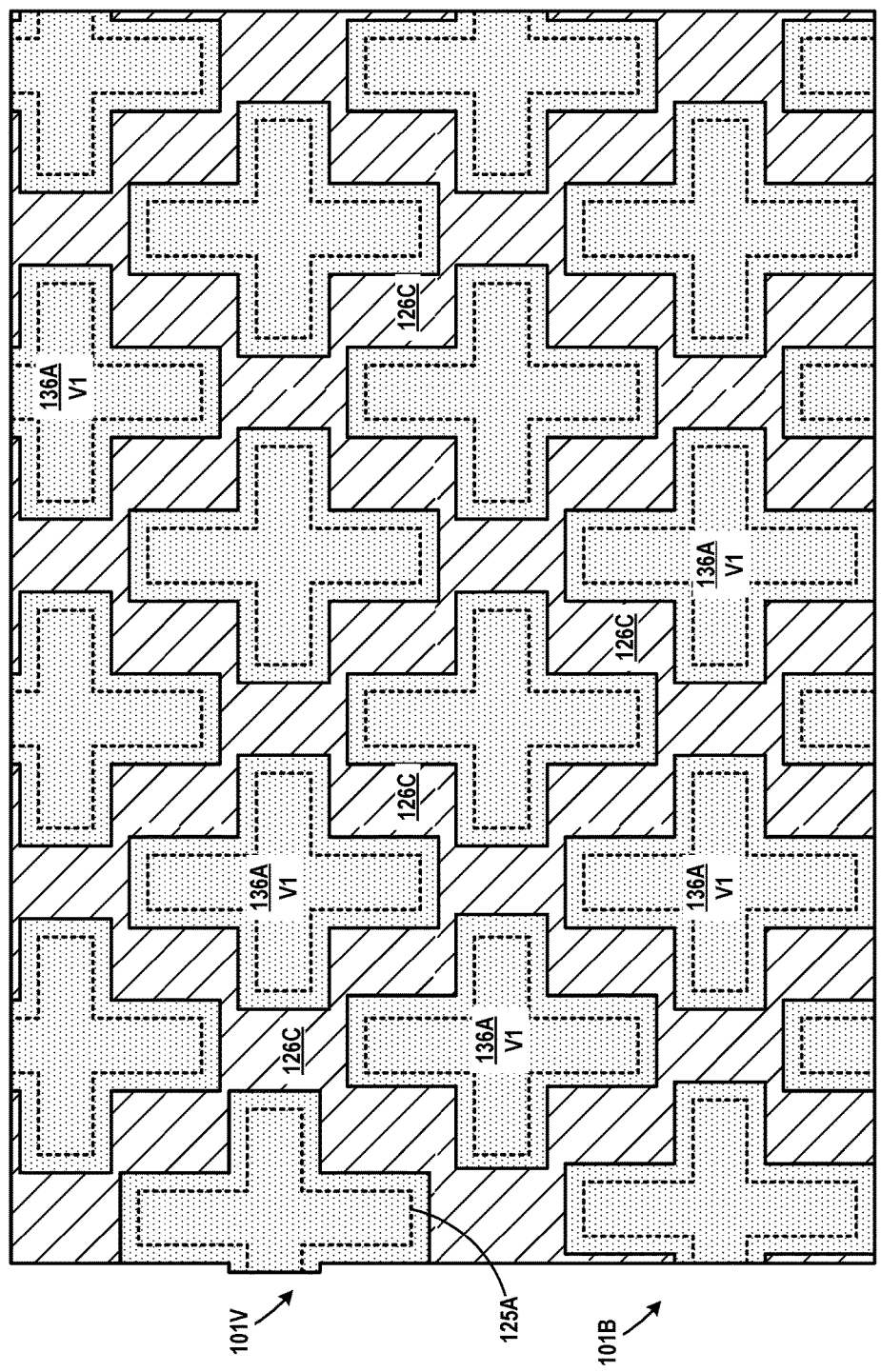

FIG. 25 depicts an embodiment wherein V vias 136A are discreet structures that have a shape that corresponds to the cross-shaped pattern of the openings 125A shown in dashed lines in FIG. 25.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A crack-stop structure, comprising:
   a first crack-stop metallization layer comprising a first metal line layer, said first metal line layer comprising a plurality of metal lines and a plurality of openings formed therein between adjacent metal lines; and
   a second crack-stop metallization layer positioned above and adjacent said first crack-stop metallization layer, said second crack-stop metallization layer comprising a second metal line layer and a via layer, said via layer comprising a plurality of vias, each having a portion that extends at least partially into one of said plurality of openings in said first metal line layer so as to thereby form a stepped, non-planar interface between said first metal line layer of said first crack-stop metallization layer and said via layer of said second crack-stop metallization layer, wherein each via contacts an uppermost surface and a sidewall surface of each of said adjacent metal lines defining said one of said plurality of openings.

2. The crack-stop structure of claim 1, wherein said plurality of openings extend through an entire thickness of said first metal line layer.

3. The crack-stop structure of claim 1, wherein each of said plurality of openings is partially filled with an insulating material that has an upper surface that is positioned at a level that is below a level of an upper surface of said first metal line layer, wherein a first portion of said vias contacts said upper surface of said first metal line layer and wherein a second portion of said vias contacts said upper surface of said insulating material so as to form said stepped, non-planar interface between said first metal line layer of said first crack-stop metallization layer and said via layer of said second crack-stop metallization layer.

4. The crack-stop structure of claim 1, wherein said first metal line layer is a M1 metal layer, said second metal line layer is a M2 metal layer, said via layer is a V1 via layer and wherein said first crack-stop metallization layer and said second crack-stop metallization layer comprise copper.

5. The crack-stop structure of claim 1, wherein each of said vias has a stepped bottom surface with a footprint area that is greater than a footprint area of one of said plurality of openings.

6. The crack-stop structure of claim 1, wherein, when viewed from above, each of said plurality of openings have one of a square configuration, a rectangular configuration or a continuous linear trench configuration and wherein said plurality of openings are arranged in a repetitive pattern.

7. The crack-stop structure of claim 1, further comprising:
   a plurality of second openings formed in said second metal line layer of said second crack-stop metallization layer; and
   a third crack-stop metallization layer positioned above and adjacent said second crack-stop metallization layer, said third crack-stop metallization layer comprising a third metal line layer and a second via layer, said second via layer comprising a plurality of second vias having a portion that extends at least partially into said plurality of second openings in said second metal line layer so as to thereby form a stepped, non-planar interface between said second metal line layer of said second crack-stop metallization layer and said second via layer of said third crack-stop metallization layer.

8. A crack-stop structure, comprising:
   a first crack-stop metallization layer comprising a first metal line layer, said first metal line layer comprising a plurality of metal lines and a plurality of openings formed therein between adjacent metal lines, wherein said plurality of openings extend through an entire thickness of said first metal line layer; and
   a second crack-stop metallization layer positioned above and adjacent said first crack-stop metallization layer, said second crack-stop metallization layer comprising a second metal line layer and a via layer, said via layer comprising a plurality of vias, wherein each of said plurality of vias has a stepped bottom surface and an extended portion that is positioned at least partially in one of said plurality of openings in said first metal line layer, wherein an interface between said vias and said plurality of openings forms a stepped, non-planar interface between said first metal line layer of said first crack-stop metallization layer and said second via layer of said second crack-stop metallization layer and wherein each of said vias has a first portion that contacts an uppermost surface of each of said adjacent metal lines defining said one of said plurality of openings around an entire perimeter of said one of said plurality of openings and a second portion that contacts a sidewall portion of each of said adjacent metal lines.

9. The crack-stop structure of claim 8, wherein each of said plurality of openings is partially filled with an insulating material that has an upper surface that is positioned at a level that is below a level of an upper surface of said first metal line layer, wherein a second portion of said via contacts said upper surface of said insulating material.

10. The crack-stop structure of claim 8, wherein said stepped bottom surface of each of said vias has a footprint area that is greater than a footprint area of said one of said plurality of openings.

11. The crack-stop structure of claim 8, further comprising:
    a plurality of second openings formed in said second metal line layer of said second crack-stop metallization layer; and
    a third crack-stop metallization layer positioned above and adjacent said second crack-stop metallization layer, said third crack-stop metallization layer comprising a third metal line layer and a second via layer, said second via layer comprising a plurality of second vias having a portion that extends at least partially into said plurality of second openings in said second metal line layer, wherein an interface between said second vias and said second openings forms a second stepped, non-planar interface between said second metal line layer of said second crack-stop metallization layer and said second via layer of said third crack-stop metallization layer.

12. A method of forming a crack-stop structure, the method comprising:
    forming a first metal line layer of a first crack-stop metallization layer, wherein said first metal line layer comprises a plurality of metal lines and a plurality of openings defined between adjacent metal lines; and
    forming a second crack-stop metallization layer above and adjacent said first crack-stop metallization layer, said second crack-stop metallization layer comprising a second metal line layer and a via layer, wherein forming said second crack-stop metallization layer comprises forming said via layer such that it has a plurality of vias, each of which comprises an extended portion that extends at least partially into one of said plurality of openings in said first metal line layer so as to thereby form a stepped, non-planar interface between said first metal line layer of said first crack-stop metallization layer and said via layer of said second crack-stop metallization layer, wherein each via contacts an uppermost surface and a sidewall surface of each of said adjacent metal lines defining said one of said plurality of openings.

13. The method of claim 12, wherein forming said plurality of openings in said first metal line layer comprises forming said plurality of openings such that they extend through an entire thickness of said first metal line layer.

14. The method of claim 12, further comprising forming an insulation material in each of said plurality of openings, wherein said insulating material has an upper surface that is positioned at a level that is below a level of an upper surface of said first metal line layer, wherein forming said plurality of vias comprises forming said plurality of vias such that a first portion of said vias contacts said upper surface of said first metal line layer and a second portion of said vias contacts said upper surface of said insulating material so as to form said stepped, non-planar interface between said first metal line layer of said first crack-stop metallization layer and said via layer of said second crack-stop metallization layer.

15. The method of claim 12, wherein forming said plurality of vias comprises forming said plurality of vias such that each of said vias has a stepped bottom surface with a footprint area that is greater than a footprint area of one of said plurality of openings.

16. The method of claim 12, further comprising:
 forming said second metal line layer such that it comprises a plurality of second openings; and
 forming a third crack-stop metallization layer above and adjacent said second crack-stop metallization layer, wherein said third crack-stop metallization layer is formed such that it comprises a third metal line layer and a second via layer, said second via layer being formed such that it comprises a plurality of second vias having an extended portion that extends at least partially into said plurality of second openings in said second metal line layer.

* * * * *